(12) United States Patent
Peterson et al.

(10) Patent No.: US 12,185,616 B1
(45) Date of Patent: Dec. 31, 2024

(54) DEVICES WITH DISPLAYS HAVING TRANSPARENT OPENINGS AND TRANSITION REGIONS

(71) Applicant: Apple Inc., Cupertino, CA (US)

(72) Inventors: Ricardo A Peterson, Fremont, CA (US); Yuchi Che, Santa Clara, CA (US); Warren S Rieutort-Louis, Cupertino, CA (US); Abbas Jamshidi Roudbari, Saratoga, CA (US); Yi Qiao, San Jose, CA (US); Yue Cui, Campbell, CA (US); Jean-Pierre S Guillou, La Jolla, CA (US); Shyuan Yang, San Mateo, CA (US); Tsung-Ting Tsai, San Jose, CA (US)

(73) Assignee: Apple Inc., Cupertino, CA (US)

( * ) Notice: Subject to any disclaimer, the term of this patent is extended or adjusted under 35 U.S.C. 154(b) by 414 days.

(21) Appl. No.: 17/840,472

(22) Filed: Jun. 14, 2022

Related U.S. Application Data

(60) Provisional application No. 63/236,593, filed on Aug. 24, 2021.

(51) Int. Cl.
*H10K 59/88* (2023.01)
*H10K 59/35* (2023.01)

(52) U.S. Cl.
CPC .......... *H10K 59/88* (2023.02); *H10K 59/352* (2023.02); *H10K 59/353* (2023.02)

(58) Field of Classification Search
CPC .... H10K 59/88; H10K 59/352; H10K 59/353; H10K 59/121; H10K 59/122
See application file for complete search history.

(56) References Cited

U.S. PATENT DOCUMENTS

| | | | |
|---|---|---|---|
| 7,355,606 B2 | 4/2008 | Paquette |
| 7,473,924 B2 | 1/2009 | Millard et al. |
| 7,781,979 B2 | 8/2010 | Lys |
| 7,940,457 B2 | 5/2011 | Jain et al. |
| 8,531,118 B2 | 9/2013 | Miskin et al. |
| 8,724,942 B2 | 5/2014 | Logunov et al. |
| 9,098,136 B2 | 8/2015 | Kim |
| 9,286,832 B2 | 3/2016 | Park et al. |

(Continued)

FOREIGN PATENT DOCUMENTS

WO 2020219267 A1 10/2020

*Primary Examiner* — Wasiul Haider
(74) *Attorney, Agent, or Firm* — Treyz Law Group, P.C.; Joseph F. Guihan; Jinie M. Guihan

(57) ABSTRACT

An electronic device may include a display and an optical sensor formed underneath the display. The display may have both a full pixel density region and a pixel removal region with a plurality of high-transmittance areas that overlap the optical sensor. To mitigate reflectance mismatch between the full pixel density region and the pixel removal region, the pixel removal region may include a transition region at one or more edges. In the transition region, one or more components may have a gradual density change between the full pixel density region and a central portion of the pixel removal region. Components that may have a changing density in the transition region include dummy thin-film transistor sub-pixels, dummy anodes, a cathode layer, and a touch sensor metal layer. The transition region may also include anodes that gradually change shape and/or size.

21 Claims, 20 Drawing Sheets

(56) References Cited

U.S. PATENT DOCUMENTS

| | | | |
|---|---|---|---|
| 10,268,884 | B2 | 4/2019 | Jones et al. |
| 11,075,353 | B2 | 7/2021 | Hou |
| 2014/0375704 | A1 | 12/2014 | Bi et al. |
| 2015/0241705 | A1 | 8/2015 | Abovitz et al. |
| 2017/0116934 | A1 | 4/2017 | Tien et al. |
| 2019/0041658 | A1 | 2/2019 | Gollier et al. |
| 2019/0094541 | A1 | 3/2019 | Choi et al. |
| 2020/0203450 | A1 | 6/2020 | Lou et al. |
| 2021/0151519 | A1* | 5/2021 | Lv .................... H10K 71/00 |
| 2022/0208896 | A1* | 6/2022 | Kwak ................ H10K 59/353 |

* cited by examiner

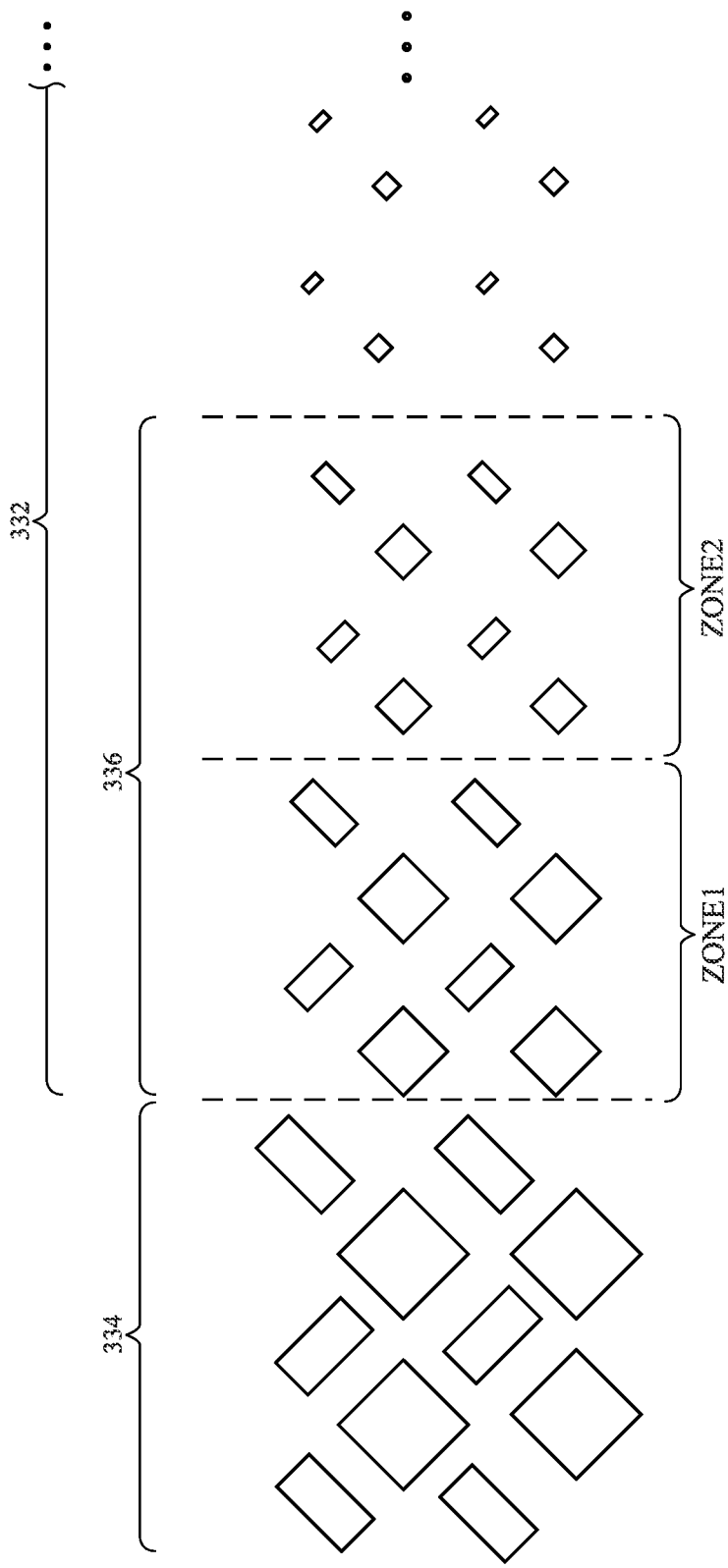

DEVICES WITH DISPLAYS HAVING TRANSPARENT OPENINGS AND TRANSITION REGIONS

This application claims priority to U.S. provisional patent application No. 63/236,593, filed Aug. 24, 2021, which is hereby incorporated by reference herein in its entirety.

BACKGROUND

This relates generally to electronic devices, and, more particularly, to electronic devices with displays.

Electronic devices often include displays. For example, an electronic device may have an organic light-emitting diode (OLED) display based on organic light-emitting diode pixels. In this type of display, each pixel includes a light-emitting diode and thin-film transistors for controlling application of a signal to the light-emitting diode to produce light. The light-emitting diodes may include OLED layers positioned between an anode and a cathode.

There is a trend towards borderless electronic devices with a full-face display. These devices, however, may still need to include sensors such as cameras, ambient light sensors, and proximity sensors to provide other device capabilities. Since the display now covers the entire front face of the electronic device, the sensors will have to be placed under the display stack. In practice, however, the amount of light transmission through the display stack is very low (i.e., the transmission might be less than 20% in the visible spectrum), which severely limits the sensing performance under the display.

It is within this context that the embodiments herein arise.

SUMMARY

An electronic device may include a display and an optical sensor formed underneath the display. The display may have both a full pixel density region and a partial pixel density region or pixel removal region. The pixel removal region includes a plurality of high-transmittance areas that overlap the optical sensor. Each high-transmittance area may be devoid of thin-film transistors and other display components. The plurality of high-transmittance areas regions is configured to increase the transmittance of light through the display to the sensor. The high-transmittance areas may therefore be referred to as transparent windows in the display.

To mitigate reflectance mismatch between the full pixel density region and the pixel removal region, the pixel removal region may include a transition region at one or more edges. In the transition region, one or more components may have a gradual density change between the full pixel density region and a central portion of the pixel removal region.

Dummy thin-film transistor sub-pixels may be included to mitigate the reflectance mismatch. The dummy thin-film transistor sub-pixels may have a gradually decreasing density from an edge of the pixel removal region towards a center of the pixel removal region. Dummy anodes may be included to mitigate the reflectance mismatch. The dummy anodes may have a gradually decreasing density from an edge of the pixel removal region towards a center of the pixel removal region. A cathode layer may have a gradually decreasing density from an edge of the pixel removal region towards a center of the pixel removal region. A touch sensor metal layer may have a gradually decreasing density from an edge of the pixel removal region towards a center of the pixel removal region.

Anodes in the pixel removal region may have a different size and/or shape than anodes in the full pixel density region. Accordingly, in a transition region between the pixel removal region and the full pixel density region, the anodes may gradually change size and/or shape from a first shape (used in the full pixel density region) to a second shape (used in the central portion of the pixel removal region).

BRIEF DESCRIPTION OF THE DRAWINGS

FIG. 20 is a top view of an illustrative transition region that includes anodes that gradually change size in accordance with an embodiment.

DETAILED DESCRIPTION

Figure 1:
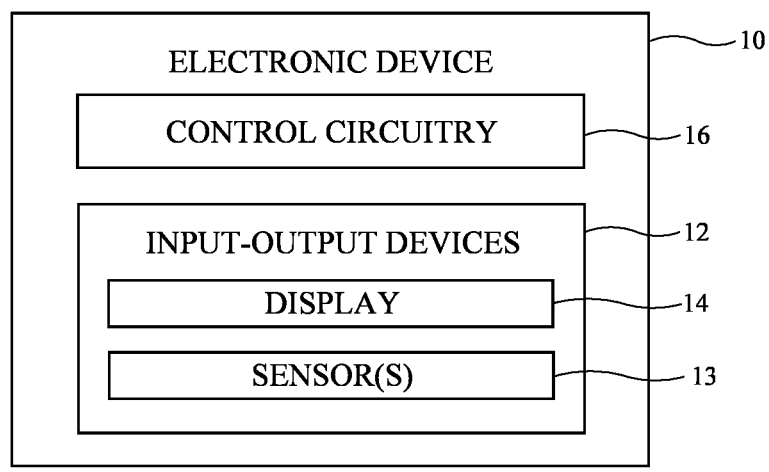
FIG. 1 is a schematic diagram of an illustrative electronic device having a display and one or more sensors in accordance with an embodiment.

An illustrative electronic device of the type that may be provided with a display is shown in FIG. 1. Electronic device 10 may be a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a display, a computer display that contains an embedded computer, a computer display that does not contain an embedded computer, a gaming device, a navigation device, an embedded system such as a system in which electronic equipment with a display is mounted in a kiosk or automobile, or other electronic equipment. Electronic device 10 may have the shape of a pair of eyeglasses (e.g., supporting frames), may form a housing having a helmet shape, or may have other configurations to help in mounting and securing the components of one or more displays on the head or near the eye of a user.

As shown in FIG. 1, electronic device 10 may include control circuitry 16 for supporting the operation of device 10. Control circuitry 16 may include storage such as hard disk drive storage, nonvolatile memory (e.g., flash memory or other electrically-programmable-read-only memory configured to form a solid-state drive), volatile memory (e.g., static or dynamic random-access memory), etc. Processing circuitry in control circuitry 16 may be used to control the operation of device 10. The processing circuitry may be based on one or more microprocessors, microcontrollers, digital signal processors, baseband processors, power management units, audio chips, application-specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input resources of input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. A touch sensor for display 14 may be formed from electrodes formed on a common display substrate with the display pixels of display 14 or may be formed from a separate touch sensor panel that overlaps the pixels of display 14. If desired, display 14 may be insensitive to touch (i.e., the touch sensor may be omitted). Display 14 in electronic device 10 may be a head-up display that can be viewed without requiring users to look away from a typical viewpoint or may be a head-mounted display that is incorporated into a device that is worn on a user's head. If desired, display 14 may also be a holographic display used to display holograms.

Control circuitry 16 may be used to run software on device 10 such as operating system code and applications. During operation of device 10, the software running on control circuitry 16 may display images on display 14.

Input-output devices 12 may also include one or more sensors 13 such as force sensors (e.g., strain gauges, capacitive force sensors, resistive force sensors, etc.), audio sensors such as microphones, touch and/or proximity sensors such as capacitive sensors (e.g., a two-dimensional capacitive touch sensor associated with a display and/or a touch sensor that forms a button, trackpad, or other input device not associated with a display), and other sensors. In accordance with some embodiments, sensors 13 may include optical sensors such as optical sensors that emit and detect light (e.g., optical proximity sensors such as transreflective optical proximity structures), ultrasonic sensors, and/or other touch and/or proximity sensors, monochromatic and color ambient light sensors, image sensors, fingerprint sensors, temperature sensors, proximity sensors and other sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 13 and/or other input-output devices to gather user input (e.g., buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.).

Display 14 may be an organic light-emitting diode display or may be a display based on other types of display technology (e.g., liquid crystal displays). Device configurations in which display 14 is an organic light-emitting diode display are sometimes described herein as an example. This is, however, merely illustrative. Any suitable type of display may be used, if desired. In general, display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
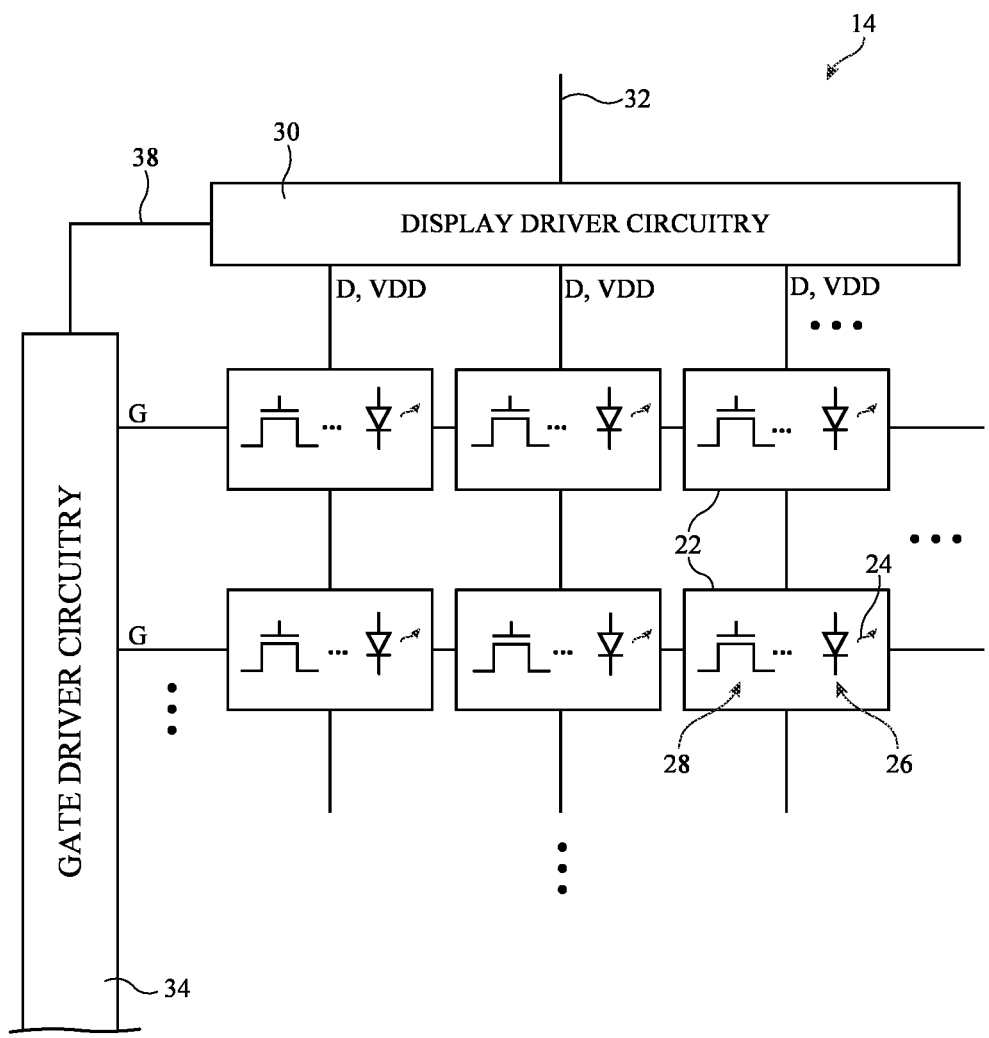
FIG. 2 is a schematic diagram of an illustrative display with light-emitting elements in accordance with an embodiment.

A top view of a portion of display 14 is shown in FIG. 2. As shown in FIG. 2, display 14 may have an array of pixels 22 formed on a substrate. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may include a light-emitting diode 26 that emits light 24 under the control of a pixel control circuit formed from thin-film transistor circuitry such as thin-film transistors 28 and thin-film capacitors. Thin-film transistors 28 may be polysilicon thin-film transistors, semiconducting-oxide thin-film transistors such as indium zinc gallium oxide (IGZO) transistors, or thin-film transistors formed from other semiconductors. Pixels 22 may contain light-emitting diodes of different colors (e.g., red, green, and blue) to provide display 14 with the ability to display color images or may be monochromatic pixels.

Display driver circuitry may be used to control the operation of pixels 22. The display driver circuitry may be formed from integrated circuits, thin-film transistor circuits, or other suitable circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply display driver circuitry 30 with information on images to be displayed on display 14.

To display the images on display pixels 22, display driver circuitry 30 may supply image data to data lines D while issuing clock signals and other control signals to supporting display driver circuitry such as gate driver circuitry 34 over path 38. If desired, display driver circuitry 30 may also supply clock signals and other control signals to gate driver circuitry 34 on an opposing edge of display 14.

Gate driver circuitry 34 (sometimes referred to as row control circuitry) may be implemented as part of an integrated circuit and/or may be implemented using thin-film transistor circuitry. Horizontal control lines G in display 14 may carry gate line signals such as scan line signals, emission enable control signals, and other horizontal control signals for controlling the display pixels 22 of each row. There may be any suitable number of horizontal control signals per row of pixels 22 (e.g., one or more row control signals, two or more row control signals, three or more row control signals, four or more row control signals, etc.).

The region on display 14 where the display pixels 22 are formed may sometimes be referred to herein as the active area. Electronic device 10 has an external housing with a peripheral edge. The region surrounding the active area and within the peripheral edge of device 10 is the border region. Images can only be displayed to a user of the device in the active region. It is generally desirable to minimize the border region of device 10. For example, device 10 may be provided with a full-face display 14 that extends across the entire front face of the device. If desired, display 14 may also wrap around over the edge of the front face so that at least part of the lateral edges or at least part of the back surface of device 10 is used for display purposes.

Figure 3:
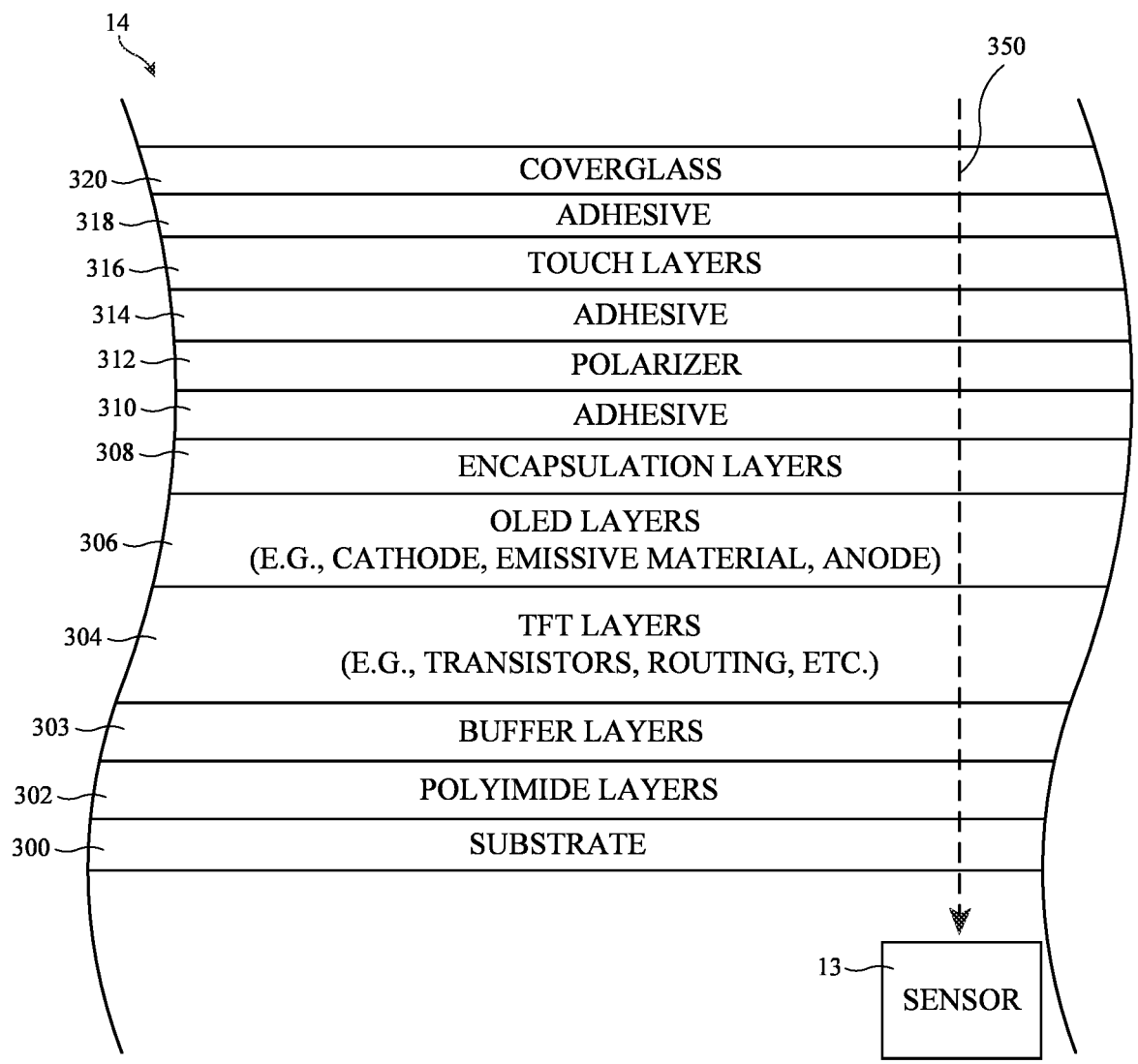
FIG. 3 is a cross-sectional side view of an illustrative display stack that at least partially covers a sensor in accordance with an embodiment.

Device 10 may include a sensor 13 mounted behind display 14 (e.g., behind the active area of the display). FIG. 3 is a cross-sectional side view of an illustrative display stack of display 14 that at least partially covers a sensor in accordance with an embodiment. As shown in FIG. 3, the display stack may include a substrate such as substrate 300. Substrate 300 may be formed from glass, metal, plastic, ceramic, sapphire, or other suitable substrate materials. In some arrangements, substrate 300 may be an organic substrate formed from polyethylene terephthalate (PET) or polyethylene naphthalate (PEN) (as examples). One or more polyimide (PI) layers 302 may be formed over substrate 300. The polyimide layers may sometimes be referred to as an organic substrate (e.g., substrate 300 is a first substrate layer and substrate 302 is a second substrate layer). The surface of substrate 302 may optionally be covered with one or more buffer layers 303 (e.g., inorganic buffer layers such as layers of silicon oxide, silicon nitride, amorphous silicon, etc.).

Thin-film transistor (TFT) layers 304 may be formed over inorganic buffer layers 303 and organic substrates 302 and 300. The TFT layers 304 may include thin-film transistor circuitry such as thin-film transistors, thin-film capacitors, associated routing circuitry, and other thin-film structures formed within multiple metal routing layers and dielectric layers. Organic light-emitting diode (OLED) layers 306 may be formed over the TFT layers 304. The OLED layers 306 may include a diode cathode layer, a diode anode layer, and emissive material interposed between the cathode and anode layers. The OLED layers may include a pixel definition layer that defines the light-emitting area of each pixel. The TFT circuitry in layer 304 may be used to control an array of display pixels formed by the OLED layers 306.

Circuitry formed in the TFT layers 304 and the OLED layers 306 may be protected by encapsulation layers 308. As an example, encapsulation layers 308 may include a first inorganic encapsulation layer, an organic encapsulation layer formed on the first inorganic encapsulation layer, and a second inorganic encapsulation layer formed on the organic encapsulation layer. Encapsulation layers 308 formed in this way can help prevent moisture and other potential contaminants from damaging the conductive circuitry that is covered by layers 308. Substrate 300, polyimide layers 302, buffer layers 303, TFT layers 304, OLED layers 306, and encapsulation layers 308 may be collectively referred to as a display panel.

One or more polarizer films 312 may be formed over the encapsulation layers 308 using adhesive 310. Adhesive 310 may be implemented using optically clear adhesive (OCA) material that offer high light transmittance. One or more touch layers 316 that implement the touch sensor functions of touch-screen display 14 may be formed over polarizer films 312 using adhesive 314 (e.g., OCA material). For example, touch layers 316 may include horizontal touch sensor electrodes and vertical touch sensor electrodes collectively forming an array of capacitive touch sensor electrodes. Lastly, the display stack may be topped off with a cover glass layer 320 (sometimes referred to as a display cover layer 320) that is formed over the touch layers 316 using additional adhesive 318 (e.g., OCA material). display cover layer 320 may be a transparent layer (e.g., transparent plastic or glass) that serves as an outer protective layer for display 14. The outer surface of display cover layer 320 may form an exterior surface of the display and the electronic device that includes the display.

Still referring to FIG. 3, sensor 13 may be formed under the display stack within the electronic device 10. As described above in connection with FIG. 1, sensor 13 may be an optical sensor such as a camera, proximity sensor, ambient light sensor, fingerprint sensor, or other light-based sensor. In some cases, sensor 13 may include a light-emitting component that emits light through the display. Sensor 13 may therefore sometimes be referred to as input-output component 13. Input-output component 13 may be a sensor or a light-emitting component (e.g., that is part of a sensor). The performance of input-output component 13 depends on the transmission of light traversing through the display stack, as indicated by arrow 350. A typical display stack, however, has fairly limited transmission properties. For instance, more than 80% of light in the visible and infrared light spectrum might be lost when traveling through the display stack, which makes sensing under display 14 challenging.

Each of the multitude of layers in the display stack contributes to the degraded light transmission to sensor 13. In particular, the dense thin-film transistors and associated routing structures in TFT layers 304 of the display stack contribute substantially to the low transmission. In accordance with an embodiment, at least some of the display pixels may be selectively removed in regions of the display stack located directly over sensor(s) 13. Regions of display 14 that at least partially cover or overlap with sensor(s) 13 in which at least a portion of the display pixels have been removed are sometimes referred to as pixel removal regions or low density pixel regions. Removing display pixels (e.g., removing transistors and/or capacitors associated with one or more sub-pixels) in the pixel removal regions can drastically help increase transmission and improve the performance of the under-display sensor 13. In addition to removing display pixels, portions of additional layers such as polyimide layers 302 and/or substrate 300 may be removed for additional transmission improvement. Polarizer 312 may also be bleached for additional transmission improvement.

Figure 4:
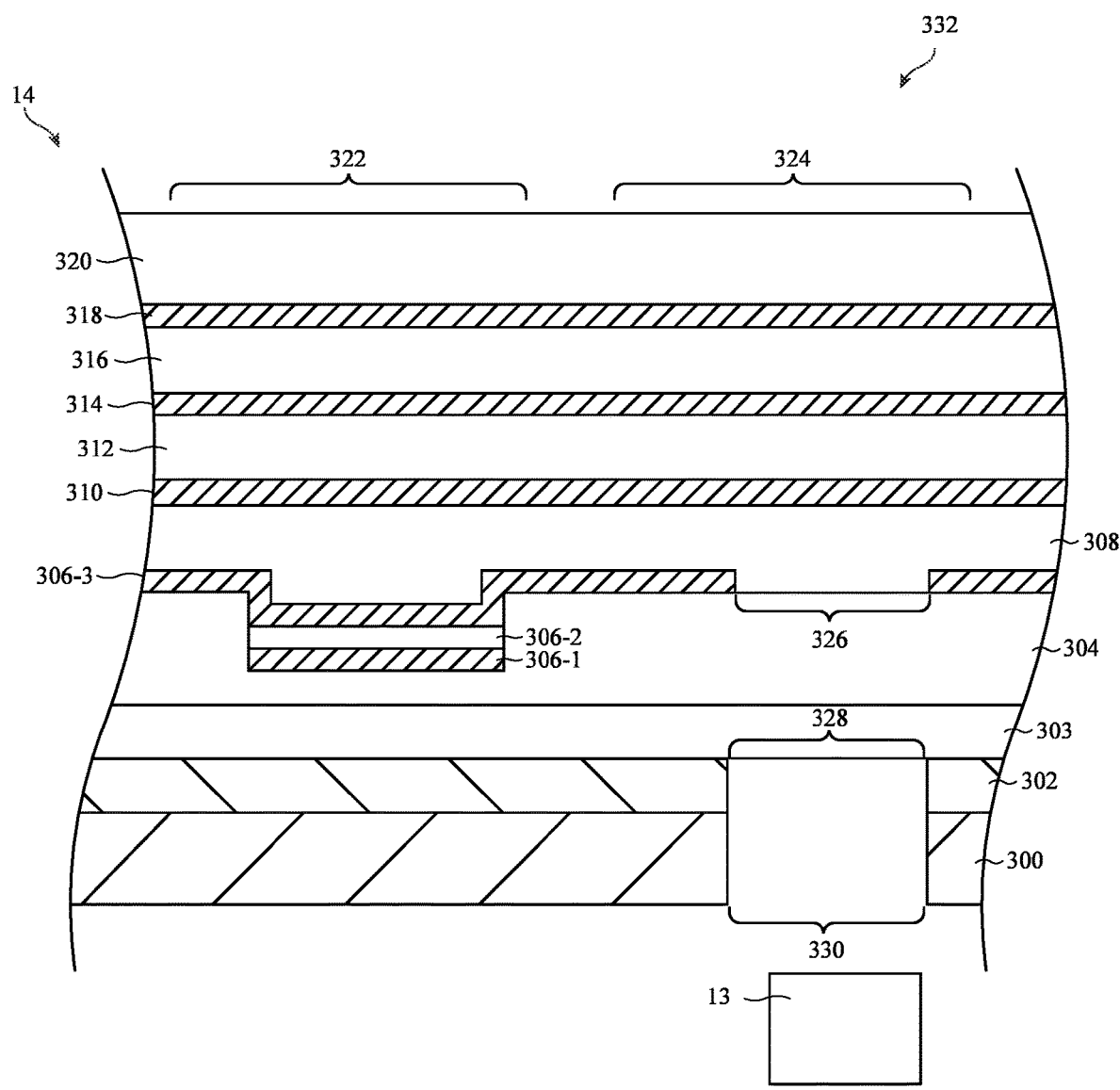
FIG. 4 is a cross-sectional side view of an illustrative display stack with a high-transmittance area that overlaps a sensor in accordance with an embodiment.

FIG. 4 is a cross-sectional side view of an illustrative display showing how pixels may be removed in a pixel removal region 332 to increase transmission through the display. As shown in FIG. 4, display 14 may include a pixel region 322 and a high-transmittance area 324. In the pixel region 322, the display may include a pixel formed from emissive material 306-2 that is interposed between an anode 306-1 and a cathode 306-3. Signals may be selectively applied to anode 306-1 to cause emissive material 306-2 to emit light for the pixel. Circuitry in thin-film transistor layer 304 may be used to control the signals applied to anode 306-1.

In high-transmittance area 324, anode 306-1 and emissive material 306-2 may be omitted. Without the high-transmittance area, an additional pixel may be formed in area 324 adjacent to the pixel in area 322. However, to increase the transmittance of light to sensor 13 under the display, the pixels in area 324 are removed. The absence of emissive material 306-2 and anode 306-1 may increase the transmittance through the display stack. Additional circuitry within thin-film transistor layer 304 may also be omitted in high-transmittance area 324 to increase transmittance.

Additional transmission improvements through the display stack may be obtained by selectively removing additional components from the display stack in high-transmittance area 324. As shown in FIG. 4, a portion of cathode 306-3 may be removed in high-transmittance area 324. This results in an opening 326 in the cathode 306-3. Said another way, the cathode 306-3 may have conductive material that defines an opening 326 in the pixel removal region. Removing the cathode in this way allows for more light to pass through the display stack to sensor 13. Cathode 306-3 may be formed from any desired conductive material. The cathode may be removed via etching (e.g., laser etching or plasma etching). Alternatively, the cathode may be patterned to have an opening in high-transmittance area 324 during the original cathode deposition and formation steps.

Polyimide layers 302 may be removed in high-transmittance area 324 in addition to cathode layer 306-3. The removal of the polyimide layers 302 results in an opening 328 in the pixel removal region. Said another way, the polyimide layer may have polyimide material that defines an opening 328 in the high-transmittance region. The polyimide layers may be removed via etching (e.g., laser etching or plasma etching). Alternatively, the polyimide layers may be patterned to have an opening in high-transmittance area 324 during the original polyimide formation steps. Removing the polyimide layer 302 in high-transmittance area 324 may result in additional transmittance of light to sensor 13 in high-transmittance area 324.

Substrate 300 may be removed in high-transmittance area 324 in addition to cathode layer 306-3 and polyimide layer 302. The removal of the substrate 300 results in an opening 330 in the high-transmittance area. Said another way, the substrate 300 may have material (e.g., PET, PEN, etc.) that defines an opening 330 in the pixel removal region. The substrate may be removed via etching (e.g., with a laser). Alternatively, the substrate may be patterned to have an opening in high-transmittance area 324 during the original substrate formation steps. Removing the substrate 300 in high-transmittance area 324 may result in additional transmittance of light in high-transmittance area 324. The polyimide opening 328 and substrate opening 330 may be considered to form a single unitary opening. When removing portions of polyimide layer 302 and/or substrate 300, inorganic buffer layers 303 may serve as an etch stop for the etching step. Openings 328 and 330 may be filled with air or another desired transparent filler.

In addition to having openings in cathode 306-3, polyimide layers 302, and/or substrate 300, the polarizer 312 in the display may be bleached for additional transmittance in the pixel removal region.

Figure 5:
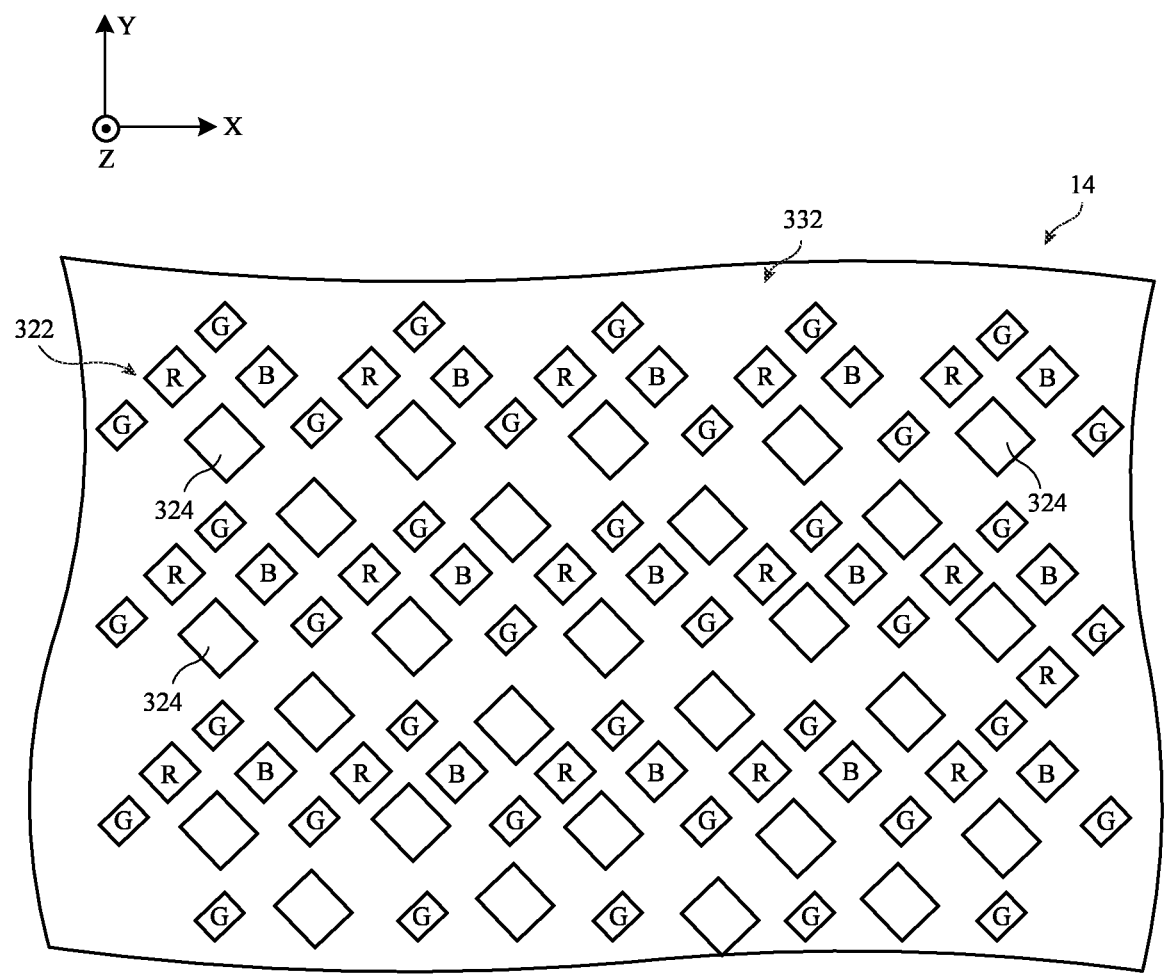
FIG. 5 is a top view of an illustrative display with transparent openings that overlap a sensor in accordance with an embodiment.

FIG. 5 is a top view of an illustrative display showing how high-transmittance areas may be incorporated into a pixel removal region 332 of the display. As shown, the display may include a plurality of pixels. In FIG. 5, there are a plurality of red pixels (R), a plurality of blue pixels (B), and a plurality of green pixels (G). The red, blue, and green pixels may be arranged in any desired pattern. Different nomenclature may be used to refer to the red, green, and blue pixels in the display. As one option, the red, blue, and green pixels may be referred to simply as pixels. As another option, the red, blue, and green pixels may instead be referred to as red, blue, and green sub-pixels. In this example, a group of sub-pixels of different colors may be referred to as pixel. In high-transmittance areas 324, no sub-pixels are included in the display (even though sub-pixels would normally be present if the normal sub-pixel pattern was followed).

To provide a uniform distribution of sub-pixels across the display surface, an intelligent pixel removal process may be implemented that systematically eliminates the closest sub-pixel of the same color (e.g., the nearest neighbor of the same color may be removed). The pixel removal process may involve, for each color, selecting a given sub-pixel, identifying the closest or nearest neighboring sub-pixels of the same color (in terms of distance from the selected sub-pixel), and then eliminating/omitting those identified sub-pixels in the final pixel removal region. With this type of arrangement, there may be high-transmittance areas in the pixel removal region, allowing a sensor or light-emitting component to operate through the display in the pixel removal region. Additionally, because some of the pixels remain present in the pixel removal region (e.g., 50% of the pixels in the layout of FIG. 5), the pixel removal region may not have a perceptibly different appearance from the rest of the display for a viewer.

As shown in FIG. 5, display 14 may include an array of high-transmittance areas 324. Each high-transmittance area 324 may have pixels removed in that area. Each high-transmittance area also has an increased transparency compared to pixel region 322. The high-transmittance areas 324 may sometimes be referred to as transparent windows 324, transparent display windows 324, transparent openings 324, transparent display openings 324, etc. The transparent display windows may allow for light to be transmitted through the display to an underlying sensor or for light to be transmitted through the display from a light source underneath the display. The transparency of transparent openings 324 (for visible and/or infrared light) may be greater than 25%, greater than 30%, greater than 40%, greater than 50%, greater than 60%, greater than 70%, greater than 80%, greater than 90%, etc. The transparency of transparent openings 324 may be greater than the transparency of pixel region 322. The transparency of pixel region 322 may be less than 25%, less than 20%, less than 10%, less than 5%, etc. The pixel region 322 may sometimes be referred to as opaque display region 322, opaque region 322, opaque footprint 322, etc. Opaque region 322 includes light emitting pixels R, G, and B, and blocks light from passing through the display.

The pattern of pixels (322) and high-transmittance areas (324) in FIG. 5 is merely illustrative. In FIG. 5, discrete high-transmittance areas 324 are depicted. However, it should be understood that these high-transmittance areas may form larger, unitary transparent openings if desired.

The pattern of sub-pixels and pixel removal regions in FIG. 5 is merely illustrative. In FIG. 5, the display edge may be parallel to the X axis or the Y axis. The front face of the display may be parallel to the XY plane such that a user of the device views the front face of the display in the Z direction. In FIG. 5, every other sub-pixel may be removed for each color. The resulting pixel configuration has 50% of the sub-pixels removed. In FIG. 5, the remaining pixels follow a zig-zag pattern across the display (with two green sub-pixels for every one red or blue sub-pixel). In FIG. 5, the sub-pixels have edges angled relative to the edges of the display (e.g., the edges of the sub-pixels are at non-zero, non-orthogonal angles relative to the X-axis and Y-axis). This example is merely illustrative. If desired, each individual sub-pixel may have edges parallel to the display edge, a different proportion of pixels may be removed for different colors, the remaining pixels may follow a different pattern, etc.

Figure 6A:
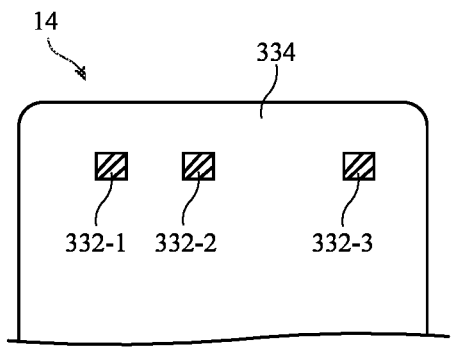
FIGS. 6A-6F are top views of illustrative displays showing possible positions for pixel removal regions in accordance with an embodiment.

In general, the display sub-pixels may be partially removed from any region(s) of display 14. FIGS. 6A-6F are front views showing how display 14 may have one or more localized pixel removal regions in which the sub-pixels are selectively removed. The example of FIG. 6A illustrates various local pixel removal regions 332 (sometimes referred to as low pixel density regions or high-transmittance region 332) physically separated from one another (i.e., the various pixel removal regions 332 are non-continuous) by full pixel density region 334. The full pixel density region 334 (sometimes referred to as full pixel density area 334) does not include any transparent windows 324 (e.g., none of the sub-pixels are removed and the display follows the pixel pattern without modifications). The full pixel density region 334 has a higher pixel density (pixels per unit area) than low pixel density regions 332. The three pixel removal regions 332-1, 332-2, and 332-3 in FIG. 6A might for example correspond to three different sensors formed underneath display 14 (with one sensor per pixel removal region).

Figure 6B:
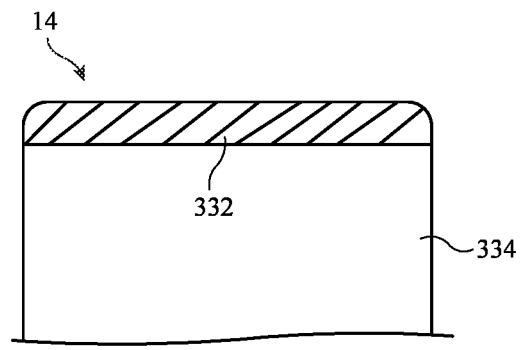
Figure 6C:
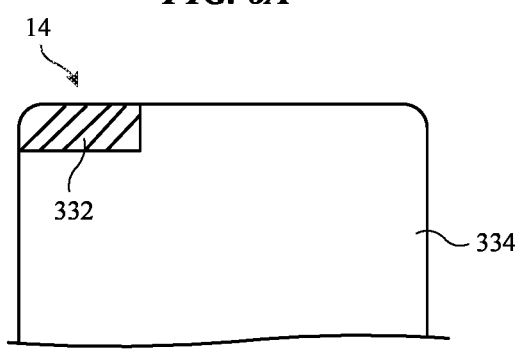
Figure 6D:
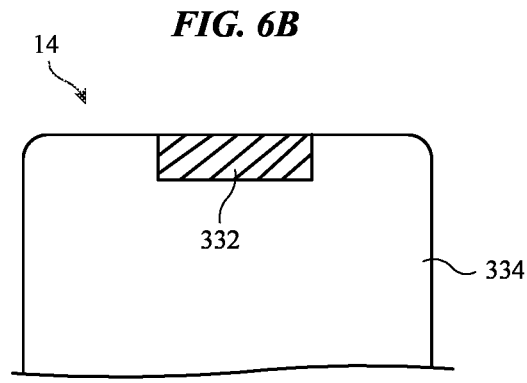
Figure 6E:
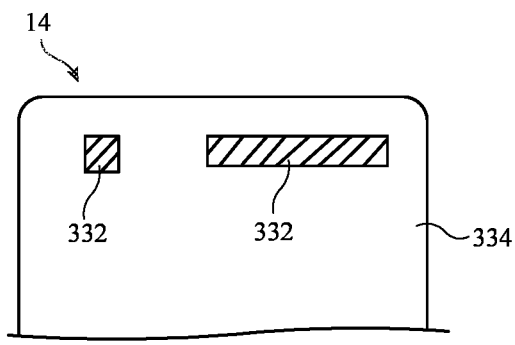
Figure 6F:
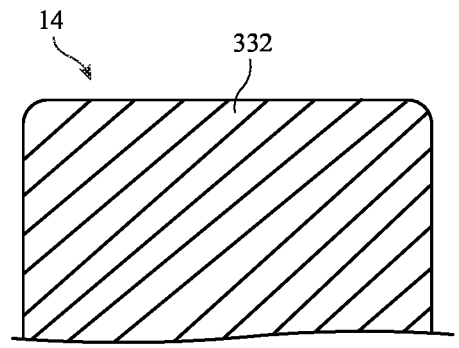

The example of FIG. 6B illustrates a continuous pixel removal region 332 formed along the top border of display 14, which might be suitable when there are many optical sensors positioned near the top edge of device 10. The example of FIG. 6C illustrates a pixel removal region 332 formed at a corner of display 14 (e.g., a rounded corner area of the display). In some arrangements, the corner of display 14 in which pixel removal region 332 is located may be a rounded corner (as in FIG. 6C) or a corner having a substantially 90° corner. The example of FIG. 6D illustrates a pixel removal region 332 formed only in the center portion along the top edge of device 10 (i.e., the pixel removal region covers a recessed notch area in the display). FIG. 6E illustrates another example in which pixel removal regions 332 can have different shapes and sizes. FIG. 6F illustrates yet another suitable example in which the pixel removal region covers the entire display surface. These examples are merely illustrative and are not intended to limit the scope of the present embodiments. If desired, any one or more portions of the display overlapping with optically based sensors or other sub-display electrical components may be designated as a pixel removal region/area.

FIG. 5 shows an example of a pixel removal region where some sub-pixels are removed in favor of transparent openings in the display. FIG. 5 shows a layout for sub-pixels within the pixel removal region. It should be noted that these layouts are for the emissive layer of each sub-pixel.

Each display pixel 22 may include both a thin-film transistor layer and an emissive layer. Each emissive layer portion may have associated circuitry on the thin-film transistor layer that controls the magnitude of light emitted from that emissive layer portion. Both the emissive layer and thin-film transistor layer may have corresponding sub-pixels within the pixel. Each sub-pixel may be associated with a different color of light (e.g., red, green, and blue). The emissive layer portion for a given sub-pixel does not necessarily need to have the same footprint as its associated thin-film transistor layer portion. Hereinafter, the term sub-pixel may sometimes be used to refer to the combination of an emissive layer portion and a thin-film transistor layer portion. Additionally, the thin-film transistor layer may be referred to as having thin-film transistor sub-pixels (e.g., a portion of the thin-film transistor layer that controls a respective emissive area, sometimes referred to as thin-film transistor layer pixels, thin-film transistor layer sub-pixels or simply sub-pixels) and the emissive layer may be referred to as having emissive layer sub-pixels (sometimes referred to as emissive pixels, emissive sub-pixels or simply sub-pixels).

Different arrangements may be used for the thin-film transistor sub-pixels and the emissive sub-pixels. FIG. 5 shows an example where the emissive sub-pixels have a horizontal zig-zag arrangement. This emissive sub-pixel arrangement may have multiple possible associated thin-film transistor sub-pixel arrangements, as shown in FIGS. 7 and 8.

Figure 7:
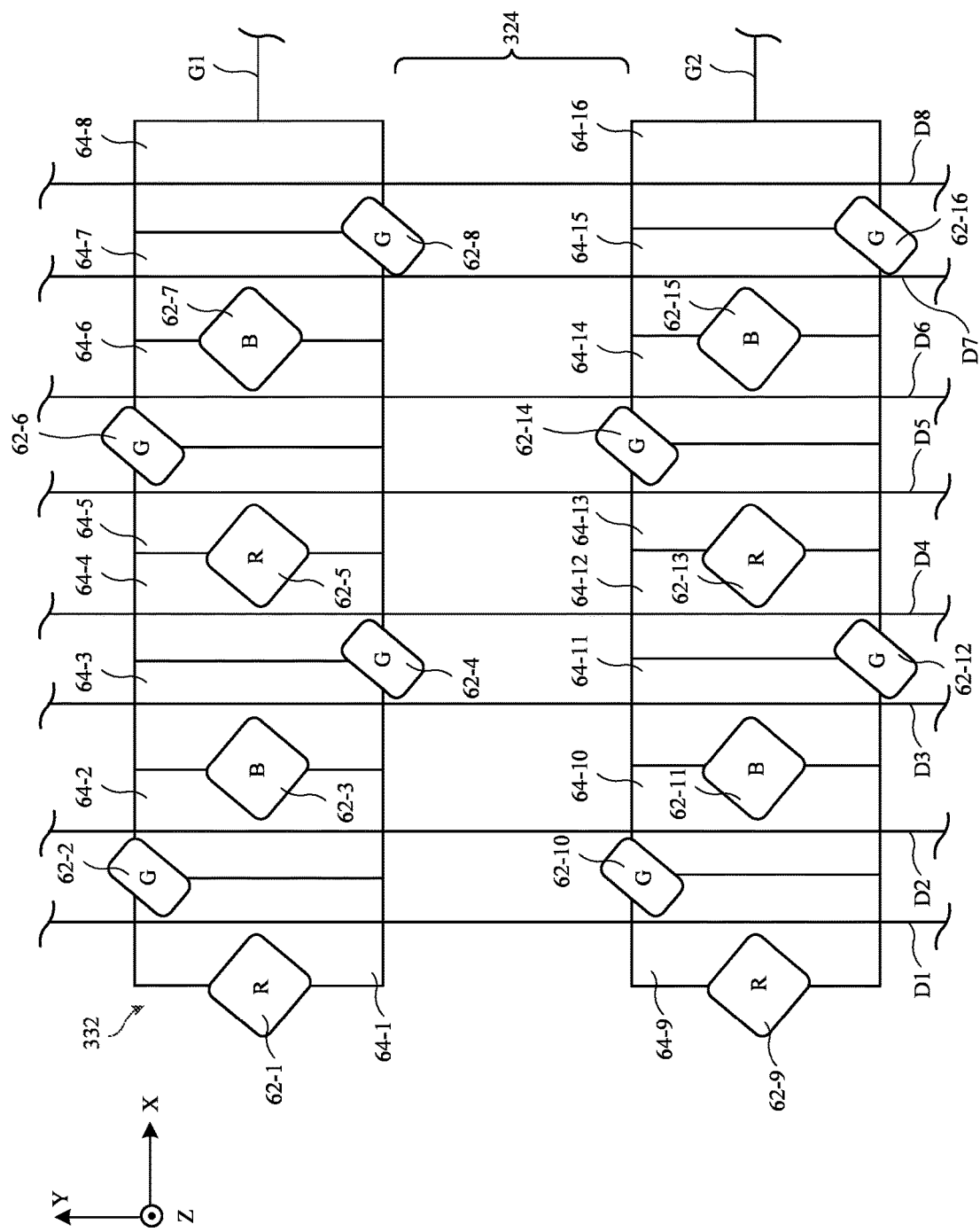
FIG. 7 is a top view of an illustrative pixel removal region in a display that has one thin-film transistor sub-pixel for each emissive sub-pixel in accordance with an embodiment.
Figure 8:
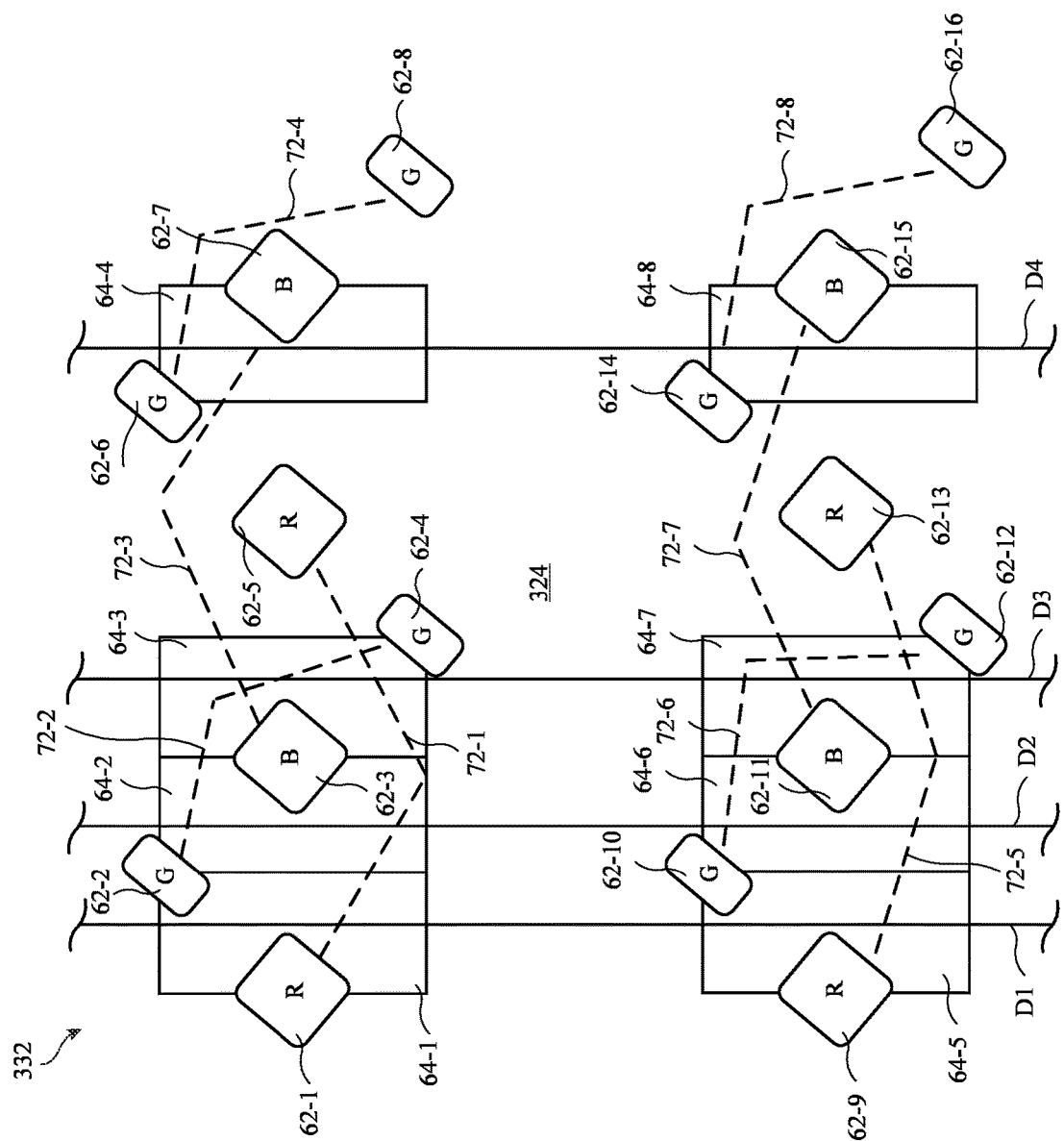
FIG. 8 is a top view of an illustrative pixel removal region in a display that has one thin-film transistor sub-pixel for every two emissive sub-pixels in accordance with an embodiment.

As shown in FIG. 7, the pixel removal region 332 may include emissive sub-pixels 62 such as red (R), green (G), and blue (B) emissive sub-pixels 62. The emissive sub-pixels 62 have the same arrangement as shown in FIG. 5 (e.g., horizontal zig-zag arrangement). Each emissive sub-pixel has a corresponding thin-film transistor sub-pixel. As shown in FIG. 6, red emissive sub-pixel 62-1 is controlled by a corresponding thin-film transistor sub-pixel 64-1, green emissive sub-pixel 62-2 is controlled by a corresponding thin-film transistor sub-pixel 64-2, blue emissive sub-pixel 62-3 is controlled by a corresponding thin-film transistor sub-pixel 64-3, green emissive sub-pixel 62-4 is controlled by a corresponding thin-film transistor sub-pixel 64-4, red emissive sub-pixel 62-5 is controlled by a corresponding thin-film transistor sub-pixel 64-5, green emissive sub-pixel 62-6 is controlled by a corresponding thin-film transistor sub-pixel 64-6, blue emissive sub-pixel 62-7 is controlled by a corresponding thin-film transistor sub-pixel 64-7, green emissive sub-pixel 62-8 is controlled by a corresponding thin-film transistor sub-pixel 64-8, red emissive sub-pixel 62-9 is controlled by a corresponding thin-film transistor sub-pixel 64-9, green emissive sub-pixel 62-10 is controlled by a corresponding thin-film transistor sub-pixel 64-10, blue emissive sub-pixel 62-11 is controlled by a corresponding thin-film transistor sub-pixel 64-11, green emissive sub-pixel 62-12 is controlled by a corresponding thin-film transistor sub-pixel 64-12, red emissive sub-pixel 62-13 is controlled by a corresponding thin-film transistor sub-pixel 64-13, green emissive sub-pixel 62-14 is controlled by a corresponding thin-film transistor sub-pixel 64-14, blue emissive sub-pixel 62-15 is controlled by a corresponding thin-film transistor sub-pixel 64-15, and green emissive sub-pixel 62-16 is controlled by a corresponding thin-film transistor sub-pixel 64-16. Each thin-film transistor sub-pixel controls the magnitude of light emitted from its corresponding emissive sub-pixel.

Each column of thin-film transistor sub-pixels is coupled to a respective data line. As shown in FIG. 7, data line D1 provides data to thin-film transistor sub-pixels 64-1 and 64-9, data line D2 provides data to thin-film transistor sub-pixels 64-2 and 64-10, data line D3 provides data to thin-film transistor sub-pixels 64-3 and 64-11, data line D4 provides data to thin-film transistor sub-pixels 64-4 and 64-12, data line D5 provides data to thin-film transistor sub-pixels 64-5 and 64-13, data line D6 provides data to thin-film transistor sub-pixels 64-6 and 64-14, data line D7 provides data to thin-film transistor sub-pixels 64-7 and 64-15, and data line D8 provides data to thin-film transistor sub-pixels 64-8 and 64-16.

In general, thin-film transistor sub-pixels 64 and emissive areas 62 may both have a low transmittance of light through the display stack. The areas between thin-film transistor sub-pixels 64 and emissive areas 62, however, may have a relatively high transmittance of light through the display stack. With the arrangement of FIG. 7, where each emissive sub-pixel has a corresponding thin-film transistor sub-pixel, there may be a high transmittance area 324 between rows of the thin-film transistor sub-pixels. Each row of thin-film transistor sub-pixels may be coupled to one or more corresponding gate lines. FIG. 7 shows an example where the first row of thin-film transistor sub-pixels (with sub-pixels 64-1 through 64-8) is coupled to gate line G1 and the second row of thin-film transistor sub-pixels (with sub-pixels 64-9 through 64-16) is coupled to gate line G2. Additional gate lines may be included for each row if desired.

In the arrangement of FIG. 7, pixel removal region 332 includes 50% of the emissive sub-pixels 62 relative to the full density pixel region 334. Additionally, there are 50% of the thin-film transistor sub-pixels 64 in pixel removal region 332 relative to the full density pixel region 334. In FIG. 7, each emissive sub-pixel 62 has a corresponding dedicated thin-film transistor sub-pixel 64. This is similar to the full pixel density region 334, where each thin-film transistor sub-pixel controls only one corresponding emissive sub-pixel.

In order to increase the transmission of light through pixel removal region 332 without reducing the light-emitting area of the display in pixel removal region 332, additional thin-film transistor sub-pixels 64 may be removed from pixel removal region 332. For example, each thin-film transistor sub-pixel may control the light emitted from two emissive sub-pixels (e.g., that are shorted together). This reduces the number of thin-film transistor sub-pixels by an additional 50% relative to the arrangement of FIG. 7. In total, when each thin-film transistor sub-pixel in the pixel removal region controls two emissive sub-pixels, the pixel removal region 332 may have 50% of the emissive sub-pixels and 25% of the thin-film transistor sub-pixels relative to the full pixel density region 334.

FIG. 8 is a top view of a pixel removal region where each thin-film transistor sub-pixel controls two respective emissive sub-pixels. As shown in FIG. 8, red emissive sub-pixel 62-1 is shorted to red emissive sub-pixel 62-5 by shorting path 72-1 and thin-film transistor sub-pixel 64-1 controls the magnitude of light emitted by both emissive sub-pixels 62-1 and 62-5. Green emissive sub-pixel 62-2 is shorted to green emissive sub-pixel 62-4 by shorting path 72-2 and thin-film transistor sub-pixel 64-2 controls the magnitude of light emitted by both emissive sub-pixels 62-2 and 62-4. Blue emissive sub-pixel 62-3 is shorted to blue emissive sub-pixel 62-7 by shorting path 72-3 and thin-film transistor sub-pixel 64-3 controls the magnitude of light emitted by both emissive sub-pixels 62-3 and 62-7. Green emissive sub-pixel 62-6 is shorted to green emissive sub-pixel 62-8 by shorting path 72-4 and thin-film transistor sub-pixel 64-4 controls the magnitude of light emitted by both emissive sub-pixels 62-6 and 62-8. Red emissive sub-pixel 62-9 is shorted to red emissive sub-pixel 62-13 by shorting path 72-5 and thin-film transistor sub-pixel 64-5 controls the magnitude of light emitted by both emissive sub-pixels 62-9 and 62-13. Green emissive sub-pixel 62-10 is shorted to green emissive sub-pixel 62-12 by shorting path 72-6 and thin-film transistor sub-pixel 64-6 controls the magnitude of light emitted by both emissive sub-pixels 62-10 and 62-12. Blue emissive sub-pixel 62-11 is shorted to blue emissive sub-pixel 62-15 by shorting path 72-7 and thin-film transistor sub-pixel 64-7 controls the magnitude of light emitted by both emissive sub-pixels 62-11 and 62-15. Green emissive sub-pixel 62-14 is shorted to green emissive sub-pixel 62-16 by shorting path 72-8 and thin-film transistor sub-pixel 64-8 controls the magnitude of light emitted by both emissive sub-pixels 62-14 and 62-16.

Each column of thin-film transistor sub-pixels is coupled to a respective data line. As shown in FIG. 8, data line D1 provides data to thin-film transistor sub-pixels 64-1 and 64-5, data line D2 provides data to thin-film transistor sub-pixels 64-2 and 64-6, data line D3 provides data to thin-film transistor sub-pixels 64-3 and 64-7, and data line D4 provides data to thin-film transistor sub-pixels 64-4 and 64-8.

Pixel removal region 332 in FIG. 8 therefore has 50% of the emissive sub-pixels, 25% of the thin-film transistor sub-pixels, and 50% of the data lines compared to a full pixel density region. Pixel removal region 332 in FIG. 8 also has 50% of the thin-film transistor sub-pixels and 50% of the data lines compared to the pixel removal region in FIG. 7. These additional omitted components in the pixel removal region allow for increased transmission through the pixel removal region, thereby improving the performance of the pixel removal region. The pixel removal region in FIG. 8 may have a transmission that is at least 10% greater than the transmission in FIG. 7, at least 20% greater than the transmission in FIG. 7, at least 30% greater than the transmission in FIG. 7, etc. The total transmission of the pixel removal region in FIG. 8 may be greater than 45%, greater than 50%, greater than 55% greater than 60%, between 50% and 60%, etc.

Shorting paths 72 may be formed by conductive routing lines on one or more layers within the display (e.g., within the thin-film transistor circuitry layer in the display). Each shorting path may electrically connect the first anode of a first emissive sub-pixel to the second anode of a second emissive sub-pixel. In this way, when a thin-film transistor sub-pixel applies a drive voltage to the first anode, the drive voltage is also applied to the second anode. Both the first and second emissive sub-pixels therefore emit approximately the same amount of light. This partially reduces the effective resolution of the display in the pixel removal region (since the shorted pixels necessarily emit the same amount of light). However, the display may still have a satisfactory appearance to the viewer in pixel removal region 332 even with the shorted emissive sub-pixels.

The arrangements for the pixel removal region 332 in FIGS. 7 and 8 are merely illustrative. In general, depending on the target transmission through the display, each thin-film transistor sub-pixel may each control one or two of the emissive sub-pixels. Additionally, it should be noted that, regardless of whether the thin-film transistor sub-pixel controls one or two emissive sub-pixels, conductive paths may be used to shift the position of a thin-film transistor sub-pixel relative to an emissive sub-pixel it controls. In other words, the conductive paths allow for the position of the emissive sub-pixel to be decoupled from the position of the thin-film transistor sub-pixel. This allows for the positions of the thin-film transistor sub-pixels and the positions of the emissive sub-pixels to be optimized independently, improving the performance of the display.

Figure 9:
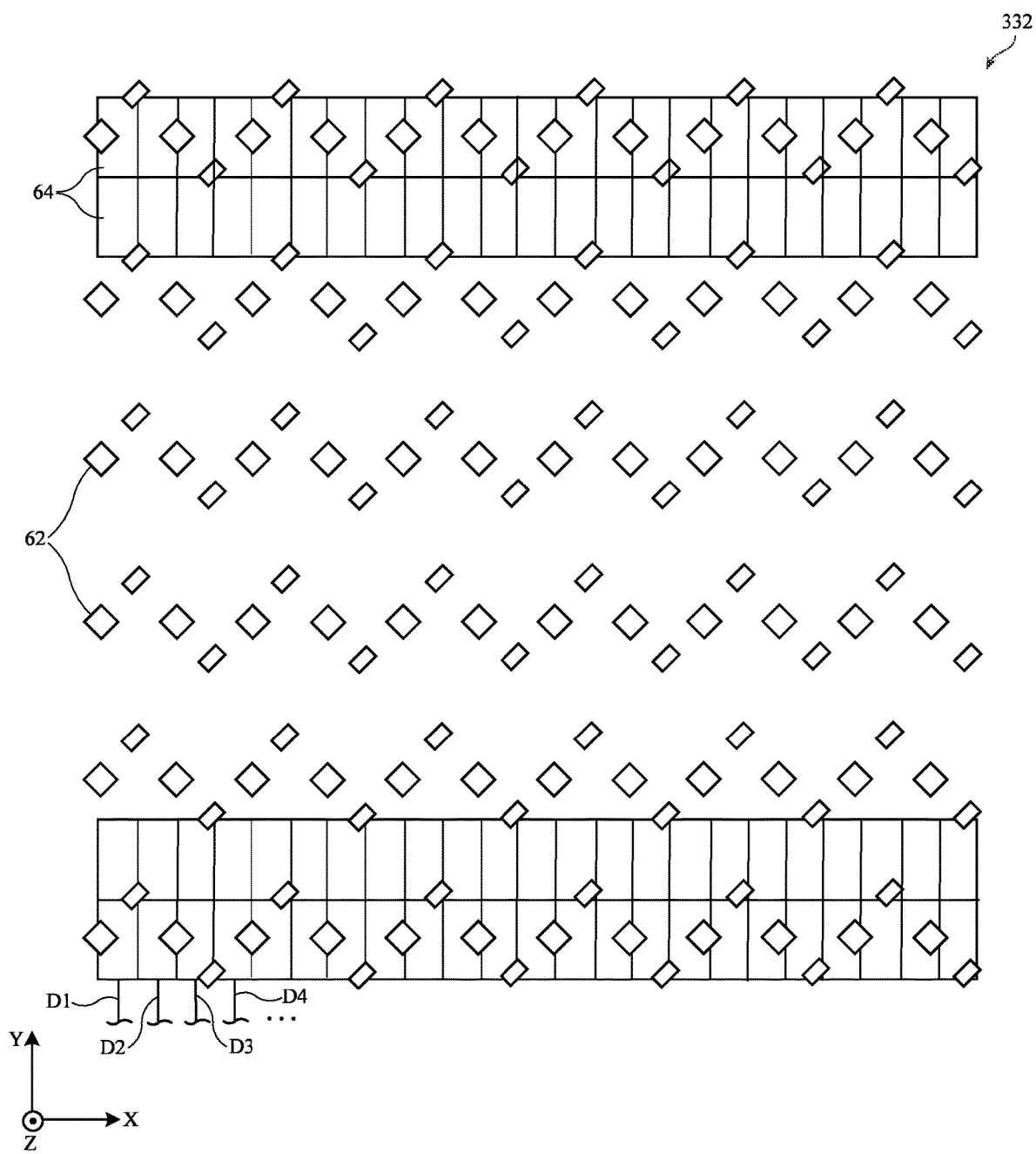
FIG. 9 is a top view of an illustrative pixel removal region in a display with thin-film transistor sub-pixels that are grouped vertically at the edges of the pixel removal region in accordance with an embodiment.

FIG. 9 is a top view of a pixel removal region where the thin-film transistor sub-pixels are grouped vertically at the edges of the pixel removal region. In this example, there are 24 columns of emissive sub-pixels 62 (e.g., having a horizontal zig-zag layout of the type shown in FIG. 5). The emissive sub-pixels in FIG. 9 are arranged in 6 horizontal zig-zag rows. Across the entire pixel removal region, there may be one thin-film transistor sub-pixel for two emissive sub-pixels (as previously discussed in connection with FIG. 8). However, the thin-film transistor sub-pixels are consolidated vertically at the edges of the pixel removal region. In other words, continuous rows of thin-film transistor sub-pixels are formed along the upper edge and the lower edge of the pixel removal region 332. This leaves the central area of the pixel removal region to have a particularly high transmittance.

Each column of thin-film transistor sub-pixels has a corresponding data line (e.g., data lines D1, D2, D3, D4, etc. in FIG. 14) and each row of thin-film transistor sub-pixels may have one or more corresponding gate lines.

FIG. 9 demonstrates how the thin-film transistor sub-pixels may be consolidated to produce larger continuous high transmittance areas in the pixel removal region 332. The example in FIG. 9 of grouping the thin-film transistor sub-pixels vertically at the edges of the pixel removal region is merely illustrative. In general, the thin-film transistor sub-pixels may be grouped in any desired manner to produce one or more high-transmittance areas having desired transmittances and shapes/sizes.

Care may be taken to ensure that the low pixel density region 332 is not perceptible to the viewer when operating electronic device 10. As previously discussed, low pixel density region 332 has a lower pixel density (e.g., 50%) than full pixel density region 334. When the display is on, a software dimming/gain scheme may be applied to the emissive sub-pixels to gradually transition between the full pixel density region 334 and the low pixel density region 332. This prevents the low pixel density region from being perceptible to the viewer when the display is on.

When the display is off, the low pixel density region 332 is still susceptible to being perceptible to the viewer. Due to the reduced number of pixels in region 332, the reflectance properties of low pixel density region 332 are different than in full pixel density region 334. To prevent these different properties from causing the low pixel density region 332 to be perceptible to the viewer when the display is off, one or more layers/components in the display may transition between full pixel density region 334 and low pixel density region 332.

Figure 10:
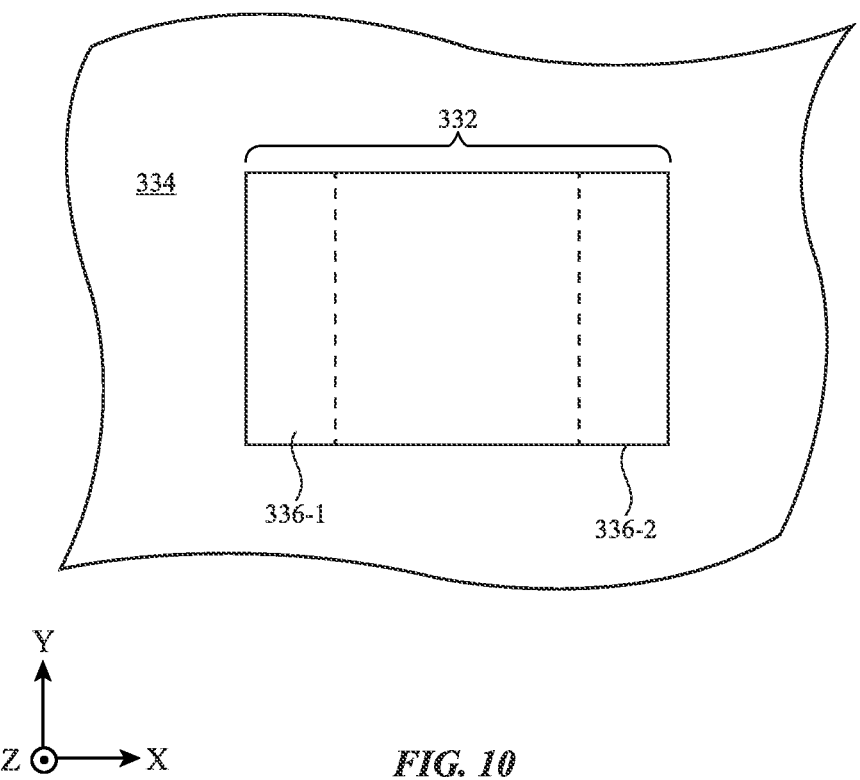
FIG. 10 is a top view of an illustrative pixel removal region that includes first and second transition regions in accordance with an embodiment.

FIG. 10 is a top view of an illustrative display that includes transition regions in low pixel density region 332. As shown, low pixel density region 332 is formed in the display and is laterally surrounded by full pixel density region 334. A first transition region 336-1 is formed adjacent to the full pixel density region 334 on the left side of low pixel density region 332. A second transition region 336-2 is formed adjacent to the full pixel density region 334 on the right side of low pixel density region 332. Herein, the transition regions 336 may be referred to as a subset of low pixel density region 332. However, the transition regions 336 may instead sometimes be referred to as separate from low pixel density region 332.

There are many possible arrangements for the sizes and shapes of transition region(s) 336 in the display. In general, any desired arrangement for the transition region(s) may be used. Each transition region may have a density transition of one or more components to improve the off-state cosmetics of the display. In general, one or more components that contribute to reflectance (e.g., the thin-film transistor sub-pixels, the emissive sub-pixels, the cathode layer, and touch sensor metal) may have a density (i.e., coverage percentage per unit area) that transitions across each transition region. This causes the reflectance to undergo a gradual, imperceptible transition between the full pixel density region and the low pixel density region (instead of an abrupt, perceptible transition).

Figure 11:
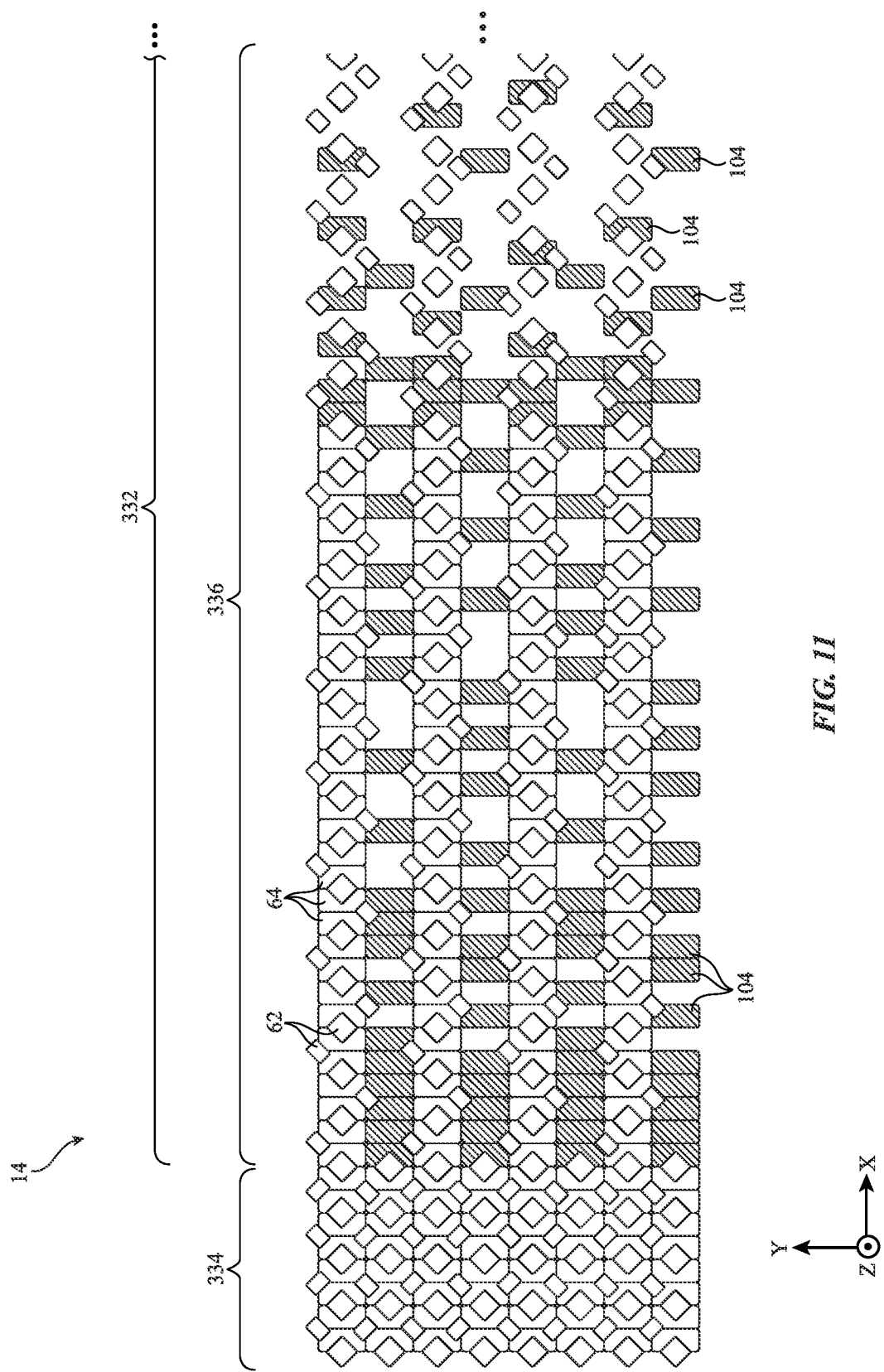
FIG. 11 is a top view of an illustrative transition region that includes dummy thin-film transistor sub-pixels in accordance with an embodiment.

FIG. 11 is a top view of an illustrative display that includes a transition region 336 that uses dummy thin-film transistor sub-pixels to approximate a gradual change in density of thin-film transistor sub-pixels. FIG. 11 shows an array of emissive sub-pixels 62. There are 50% of the emissive sub-pixels in low pixel density region 332 than in full pixel density region 334. In FIG. 11, the emissive sub-pixels 62 make an abrupt transition at the interface of full pixel density region 334 and low pixel density region 332. The display also includes thin-film transistor sub-pixels 64. In full pixel density region 334, each emissive sub-pixel is controlled by a respective thin-film transistor sub-pixel. In low pixel density region 332, each thin-film transistor sub-pixel controls two respective emissive sub-pixels. Additionally, the thin-film transistor sub-pixels are consolidated in each row adjacent to the full pixel density region 334.

In the example of FIG. 11, there are 32 thin-film transistor sub-pixels on the left edge of low pixel density region 332. These 32 thin-film transistor sub-pixels may therefore be used to control 64 respective emissive sub-pixels. This example is merely illustrative. In an alternate embodiment, 64 thin-film transistor sub-pixels may be included to control 64 respective emissive sub-pixels.

To gradually transition the thin-film transistor sub-pixel density in transition region 336, the transition region 336 includes dummy thin-film transistor sub-pixels 104 (sometimes referred to as dummy thin-film transistor structures 104, dummy structures 104, etc.). The dummy thin-film transistor sub-pixels do not serve an electrical function for the display. In other words, each dummy thin-film transistor sub-pixel is not electrically connected to any emissive sub-pixels. The dummy thin-film transistor sub-pixels 104 may be formed from a metal layer that is also included in the thin-film transistor sub-pixels 64. The overall reflectance RDUMMY of each dummy thin-film transistor sub-pixel 104 may be similar to the reflectance RTFT of each thin-film transistor sub-pixel 64 (e.g., RDUMMY is within 50% of RTFT, RDUMMY is within 40% of RTFT, RDUMMY is within 30% of RTFT, RDUMMY is within 20% of RTFT, RDUMMY is within 10% of RIFT, RDUMMY is within 5% of RTFT, RDUMMY is within 1% of RTFT, etc.).

As shown in FIG. 11, the dummy thin-film transistor sub-pixels 104 are included with a gradually decreasing density in the X-direction from the full pixel density region towards the central portion of the pixel removal region 332. Accordingly, the overall density of thin-film transistor sub-pixels (i.e., including both the functional sub-pixels 64 and dummy sub-pixels 104) has a gradually decreasing density in the X-direction from the full pixel density region towards the central portion (e.g., the portion between the transition regions) of the pixel removal region 332. This results in the display having a gradually decreasing reflectance in the X-direction from the full pixel density region 334 towards the central portion of the pixel removal region 332 while in the off state.

Figure 12A:
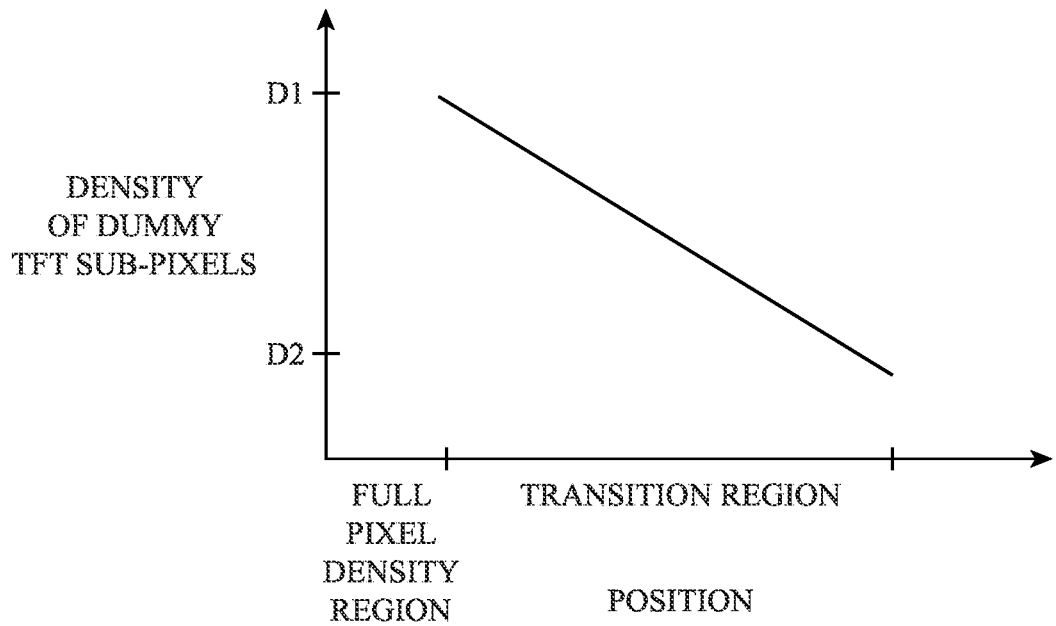
FIG. 12A is a graph of the density of the dummy thin-film transistor sub-pixels as a function of position across the transition region in accordance with an embodiment.

FIG. 12A is a graph showing the density of the dummy thin-film transistor sub-pixels as a function of position across the display. As shown, at the interface between the full pixel density region and the transition region, the dummy thin-film transistor sub-pixels may have a density of D1 or near D1 (e.g., the same density as in the full pixel density region). D1 may be 100% for example (as in FIG. 11). The density then gradually decreases across the transition region from D1 to D2. D2 may be equal to the density of the thin-film transistor sub-pixels in a central portion of the pixel removal region (e.g., a minimum thin-film transistor sub-pixel density for the pixel removal region). In FIG. 11, D2 is equal to 0%. However, D2 may instead be equal to 50% (e.g., if the pixel removal region has the arrangement of FIG. 7).

Figure 12B:
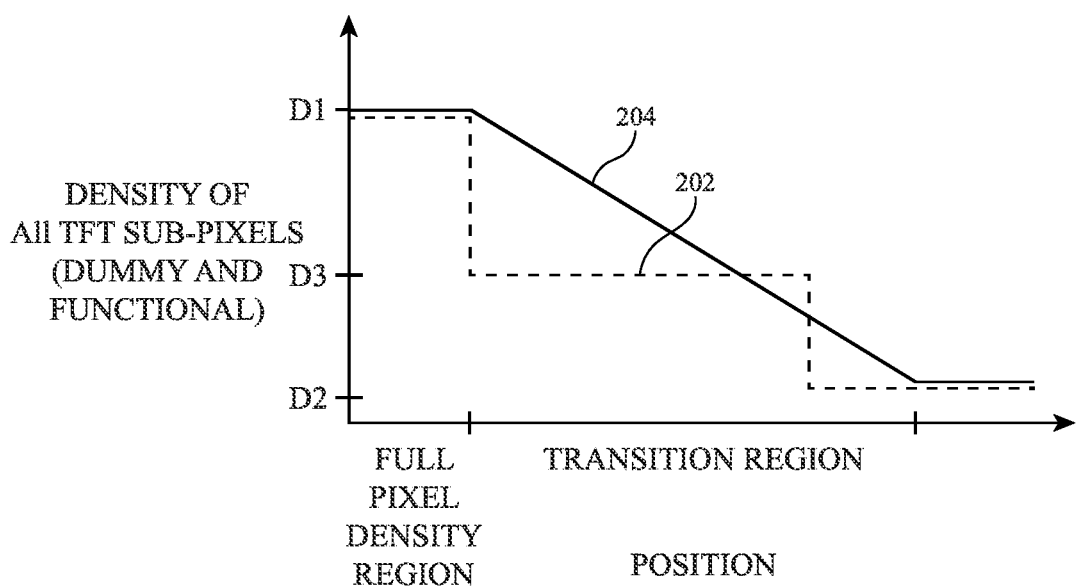
FIG. 12B is a graph of the density of all of the thin-film transistor sub-pixels as a function of position in accordance with an embodiment.

FIG. 12B is a graph showing the density of the thin-film transistor sub-pixels (including both dummy structures and functional TFT sub-pixels) as a function of position across the display. Profile 202 shows the density of the functional thin-film transistor sub-pixels alone (in an example where no dummy sub-pixels are included). As shown, there is a first step change (from D1 to D3) in the TFT sub-pixel density at the interface between the full pixel density region and the pixel removal region. There is then a second step change (from D3 to D2) in the TFT sub-pixel density. The first step change may correspond, for example, to a change from 100% density in full pixel density region 334 to 50% density in pixel removal region 332 in FIG. 11. The second step change may correspond, for example, to a change from 50% density in an edge portion of pixel removal region 332 to 0% density in a central portion of pixel removal region 332. These step changes in TFT sub-pixel density (without the presence of the dummy structures) may result in perceptible reflectance changes when the display is off.

Profile 204 shows the density of the thin-film transistor sub-pixels (including both dummy structures and functional TFT sub-pixels) from FIG. 11 as a function of position across the display. As shown, with the presence of the dummy thin-film transistor sub-pixels, the overall sub-pixel density gradually decreases from D1 (at the interface of the pixel removal region/transition region and the full pixel density region) to D2 (the minimum density at a central portion of the pixel removal region).

Figure 13:
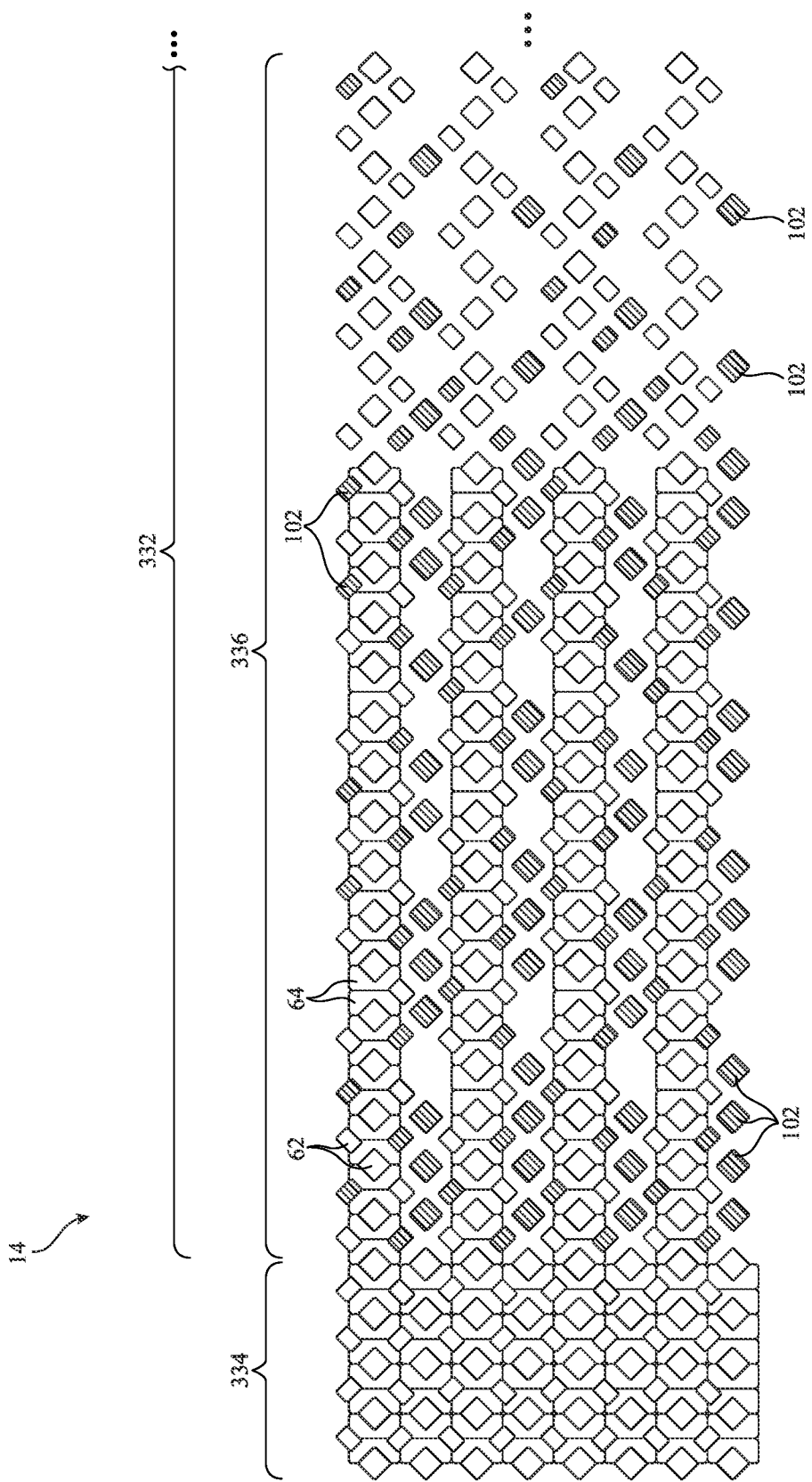
FIG. 13 is a top view of an illustrative transition region that includes dummy anodes in accordance with an embodiment.

FIG. 13 is a top view of an illustrative display that includes a transition region 336 that uses dummy anodes to approximate a gradual change in density of emissive sub-pixels. FIG. 13 shows an array of emissive sub-pixels 62. There are 50% of the emissive sub-pixels in low pixel density region 332 than in full pixel density region 334. In FIG. 11, the emissive sub-pixels 62 make an abrupt transition at the interface of full pixel density region 334 and low pixel density region 332. In FIG. 13, to gradually transition the emissive sub-pixel density in transition region 336, the transition region 336 includes dummy emissive sub-pixels 102 (sometimes referred to as dummy emissive structures 102, dummy structures 102, dummy anodes 102, etc.). The dummy anodes do not serve an electrical function for the display. In other words, each dummy anode is not electrically connected to a respective thin-film transistor sub-pixel and/or does not have associated emissive OLED layers.

The dummy anodes 102 may be formed from a metal layer that is also included in the emissive sub-pixels 62. For example, each dummy anode 102 may be formed from the same layer of metal that is patterned to form functioning anodes for the emissive sub-pixels 62. The overall reflectance RDA of each dummy anode 102 may be similar to the reflectance RA of each emissive sub-pixel 64 (e.g., RDA is within 50% of RA, RDA is within 40% of RA, RDA is within 30% of RA, RDA is within 20% of RA, RDA is within 10% of RA, RDA is within 5% of RA, RDA is within 1% of RA, etc.).

As shown in FIG. 13 the dummy anodes 102 are included with a gradually decreasing density in the X-direction from the full pixel density region towards the central portion of the pixel removal region 332. Accordingly, the overall density of emissive-sub-pixels (i.e., including both the functional sub-pixels 62 and dummy sub-pixels 102) has a gradually decreasing density in the X-direction from the full pixel density region towards the central portion of the pixel removal region 332. This results in the display having a gradually decreasing reflectance in the X-direction from the full pixel density region towards the central portion of the pixel removal region 332 while in the off state.

In FIG. 13, the display also includes thin-film transistor sub-pixels 64. In full pixel density region 334, each emissive sub-pixel is controlled by a respective thin-film transistor sub-pixel. In low pixel density region 332, each thin-film transistor sub-pixel controls two respective emissive sub-pixels. Additionally, the thin-film transistor sub-pixels are consolidated in each row adjacent to the full pixel density region 334. In the example of FIG. 13, there are 32 thin-film transistor sub-pixels on the left edge of low pixel density region 332. These 32 thin-film transistor sub-pixels may therefore be used to control 64 respective emissive sub-pixels. This example is merely illustrative. In an alternate embodiment, 64 thin-film transistor sub-pixels may be included to control 64 respective emissive sub-pixels.

Figure 14A:
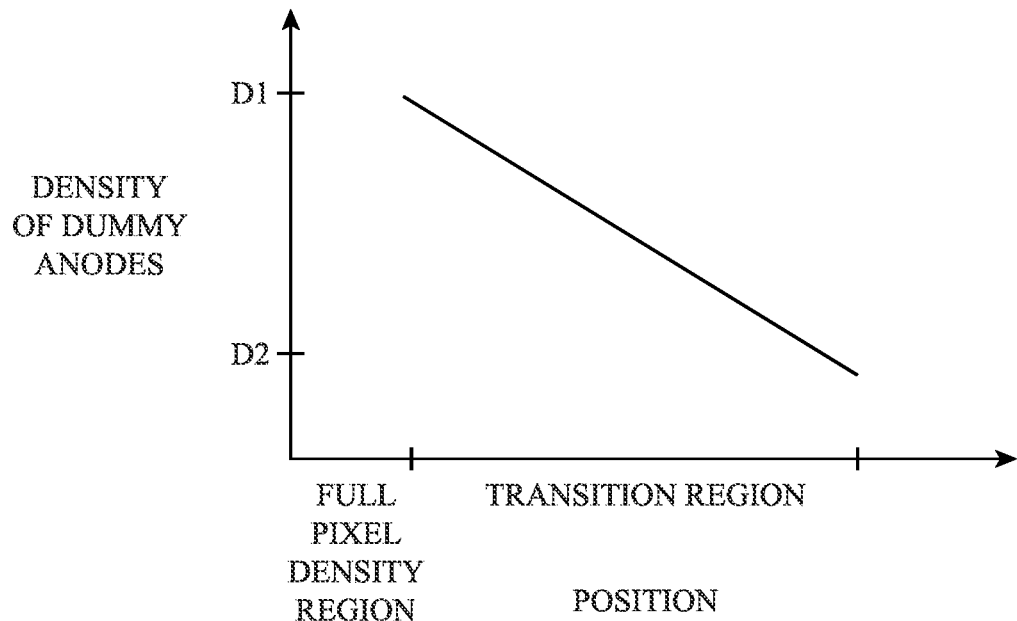
FIG. 14A is a graph of the density of the dummy anodes as a function of position across the transition region in accordance with an embodiment.

FIG. 14A is a graph showing the density of the dummy anodes as a function of position across the display. As shown, at the interface between the full pixel density region and the transition region, the dummy anodes may have a density of D1 or near D1 (e.g., the same density as in the full pixel density region). The density then gradually decreases across the transition region from D1 to D2. D2 may be equal to the density of the emissive sub-pixels in a central portion of the pixel removal region (e.g., a minimum emissive sub-pixel density for the pixel removal region). In FIG. 13, D2 is equal to 50% of D1. This example is merely illustrative and other D1 to D2 ratios may be used if desired.

Figure 14B:
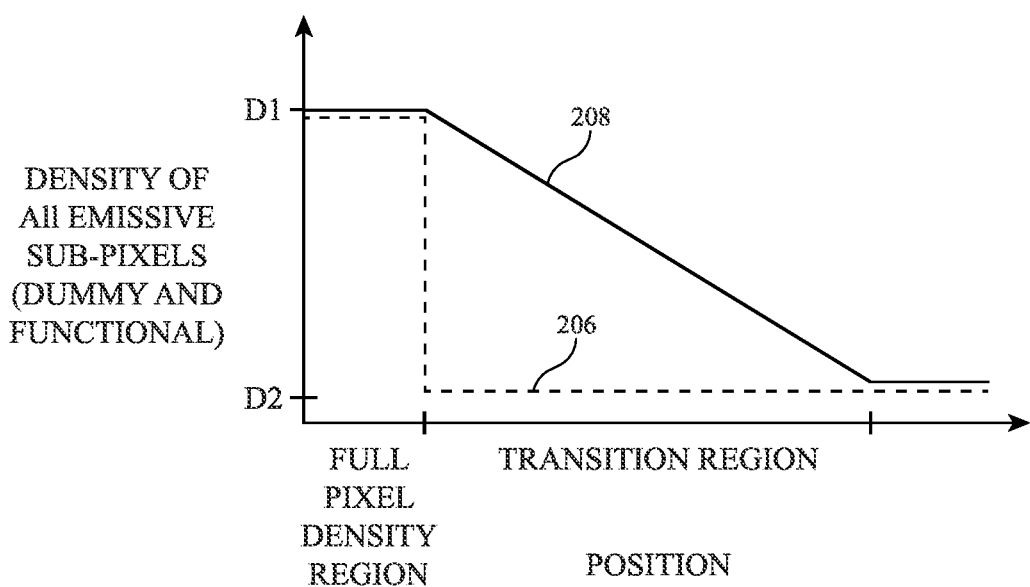
FIG. 14B is a graph of the density of all of the emissive sub-pixels as a function of position in accordance with an embodiment.

FIG. 14B is a graph showing the density of the emissive sub-pixels (including both dummy structures and functional emissive sub-pixels) as a function of position across the display. Profile 206 shows the density of the functional emissive sub-pixels alone (in an example where no dummy anodes are included). As shown, there is a step change from D1 to D2 in the emissive sub-pixel density at the interface between the full pixel density region and the pixel removal region. These step changes in emissive sub-pixel density (without the presence of the dummy structures) may result in perceptible reflectance changes when the display is off. Profile 208 shows the density of the emissive sub-pixels (including both dummy anodes and functional emissive sub-pixels) from FIG. 13 as a function of position across the display. As shown, with the presence of the dummy anodes, the overall emissive sub-pixel density gradually decreases from D1 (at the interface of the pixel removal region/transition region and the full pixel density region) to D2 (the minimum density at a central portion of the pixel removal region).

Figure 15:
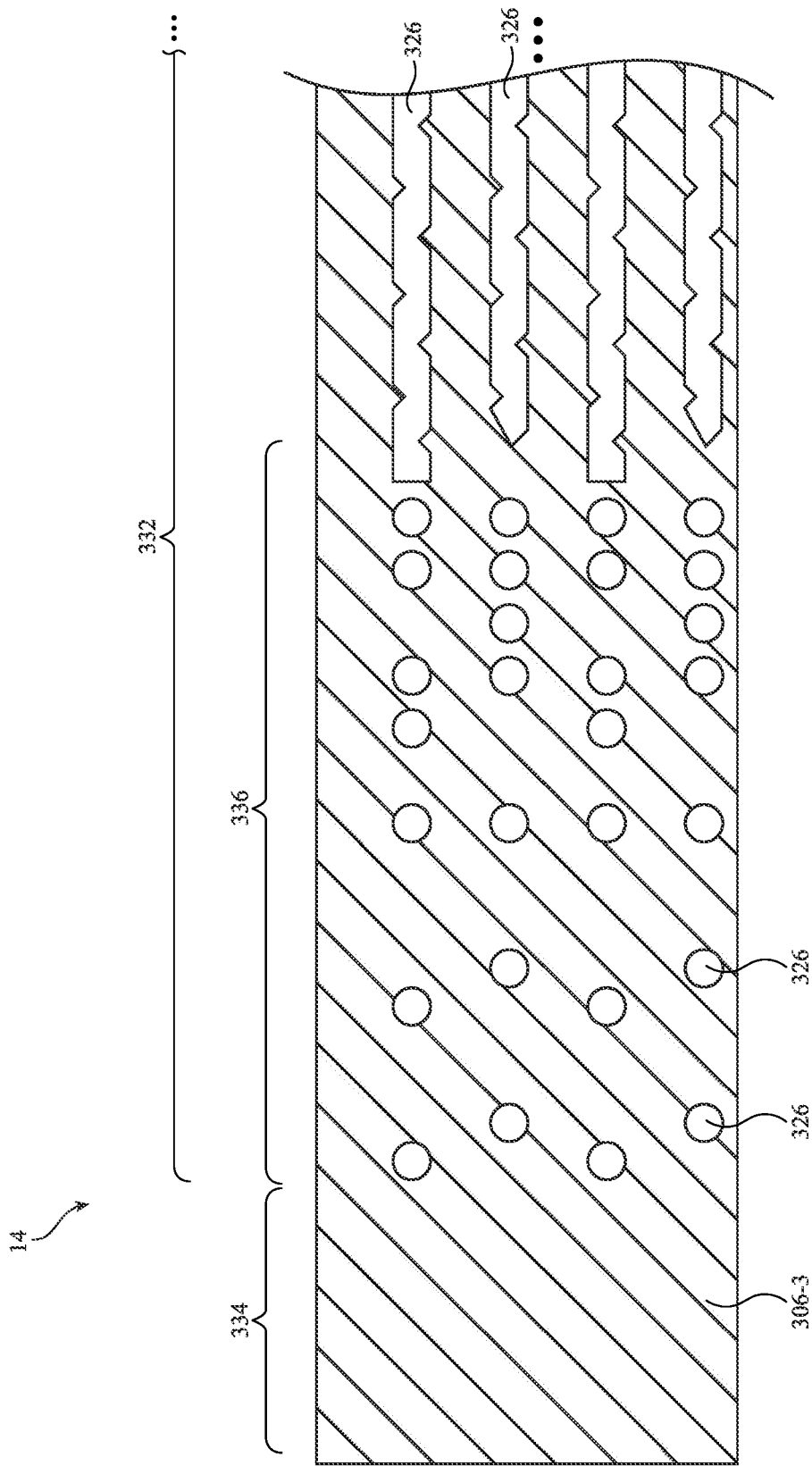
FIG. 15 is a top view of an illustrative transition region that includes a cathode layer with progressively decreasing density in accordance with an embodiment.

FIG. 15 is a top view of an illustrative display that includes a transition region 336 that uses cathode openings to approximate a gradual change in density of cathode layer 306-3. As discussed in connection with FIG. 4, cathode layer 306-3 may be patterned in the pixel removal region 332 to increase the transmission in the pixel removal region. In the example of FIG. 15, a central portion of pixel removal region 332 may have cathode openings 326. In the full pixel density area, the cathode may have a density (e.g., coverage per unit area) of 100%. In other words, the cathode is formed as a blanket layer across the pixel array without any openings in the full pixel density area. In the central portion of the pixel removal region, the cathode may have a density (e.g., coverage per unit area) of less than 90%, less than 70%, less than 60%, less than 50%, between 40% and 70%, 50%, between 45% and 55%, etc.).

To gradually transition between the full pixel density region 334 (where the cathode 306-3 has 100% coverage) to the central portion of pixel removal region 332 (where the cathode has a second, lower coverage), additional openings 326 are included in transition region 336. As shown in FIG. 15, the cathode openings 326 are included with a gradually increasing density in the X-direction from the full pixel density region towards the central portion of the pixel removal region 332. Accordingly, the overall density (coverage) of cathode layer 306-3 gradually decreases in the X-direction from the full pixel density region towards the central portion of the pixel removal region 332. This results in the display having a gradually decreasing reflectance in the X-direction from the full pixel density region towards the central portion of the pixel removal region 332 while in the off state.

Figure 16:
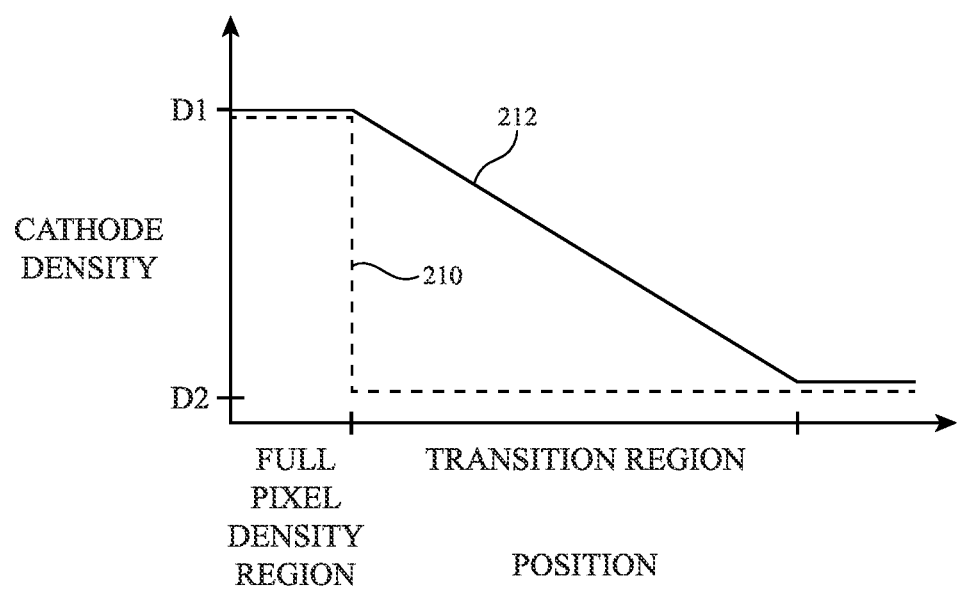
FIG. 16 is a graph of the density of the cathode as a function of position in accordance with an embodiment.

FIG. 16 is a graph showing the density of the cathode (e.g., the coverage per unit area) as a function of position across the display. Profile 210 shows the density of the cathode in an embodiment where the additional openings of the transition region are omitted. As shown, there is a step change from D1 to D2 in the cathode density at the interface between the full pixel density region and the pixel removal region. The step change may correspond, for example, to a change from 100% density in full pixel density region 334 to approximately 50% density in pixel removal region 332 in FIG. 15. This step change in cathode density may result in perceptible reflectance changes when the display is off.

Profile 212 shows the density of the cathode from FIG. 15 as a function of position across the display. As shown, with the presence of the openings in the transition region, the overall cathode density gradually decreases from D1 (at the interface of the pixel removal region/transition region and the full pixel density region) to D2 (the minimum density at a central portion of the pixel removal region).

Figure 17:
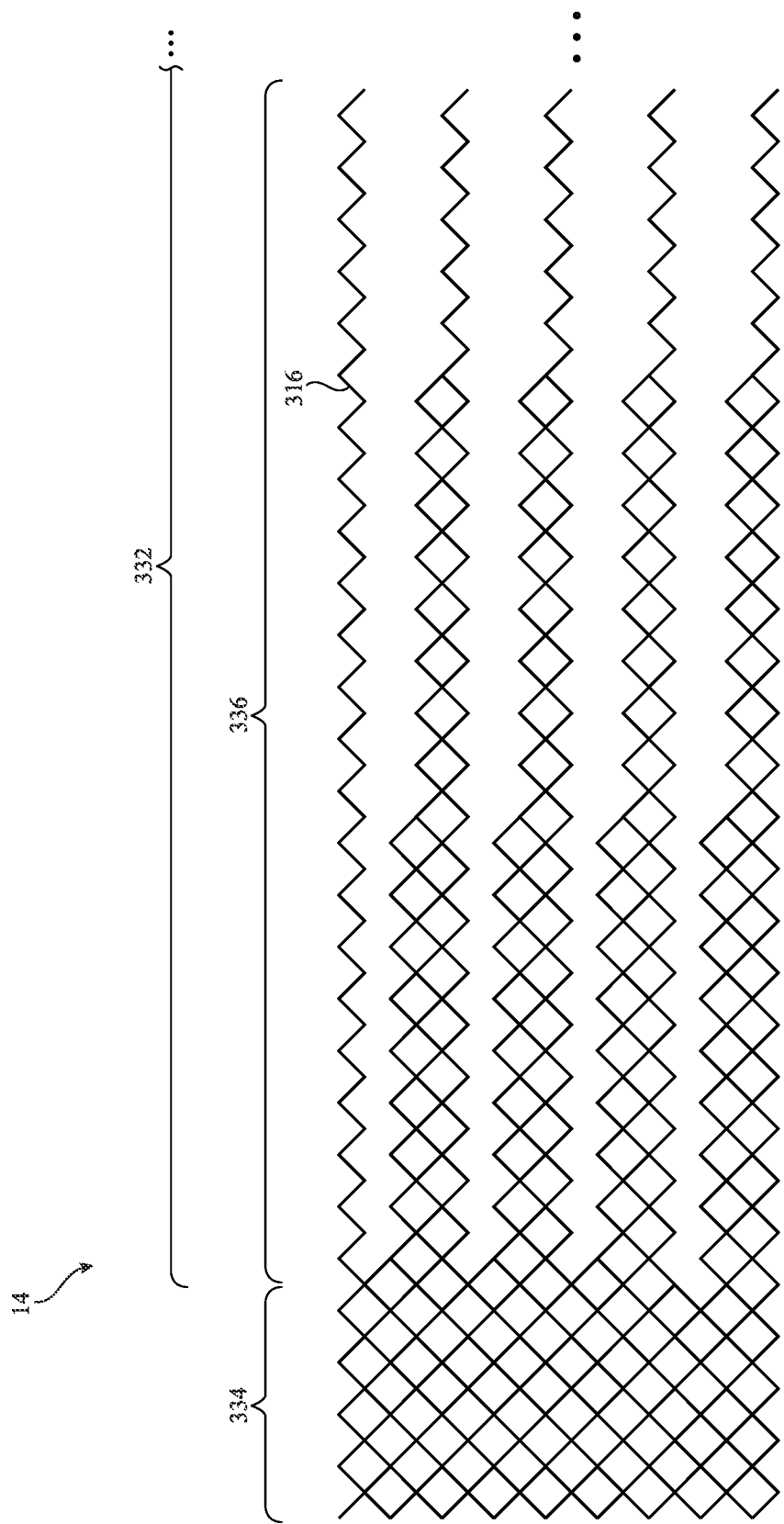
FIG. 17 is a top view of an illustrative transition region that includes a touch sensor metal layer with progressively decreasing density in accordance with an embodiment.

FIG. 17 is a top view of an illustrative display that includes a transition region 336 that has a gradual change in density of touch sensor metal. As discussed in connection with FIG. 3, one or more touch layers 316 that implement the touch sensor functions of touch-screen display 14 may be formed over polarizer films 312 using adhesive 314 (e.g., OCA material). For example, touch layers 316 may include horizontal touch sensor electrodes and/or vertical touch sensor electrodes collectively forming an array of capacitive touch sensor electrodes. FIG. 17 shows touch sensor metal (electrodes) that extends across the display.

To increase transmission in pixel removal region 332, the touch sensor metal may be omitted entirely (or included at a reduced density) in pixel removal region 332. In the example of FIG. 17, a central portion of pixel removal region 332 may have no touch sensor metal 316 (e.g., 0% density).

To gradually transition between the full pixel density region 334 (where the touch sensor metal 316 has a maximum coverage) to the central portion of pixel removal region 332 (where the cathode has a minimum coverage), the touch sensor metal 316 may be gradually transitioned between the maximum density and minimum density in transition region 336. As shown in FIG. 17, the touch sensor metal 316 has a gradually decreasing density in the X-direction from the full pixel density region towards the central portion of the pixel removal region 332. This results in the display having a gradually decreasing reflectance in the X-direction from the full pixel density region towards the central portion of the pixel removal region 332 while in the off state.

Figure 18:
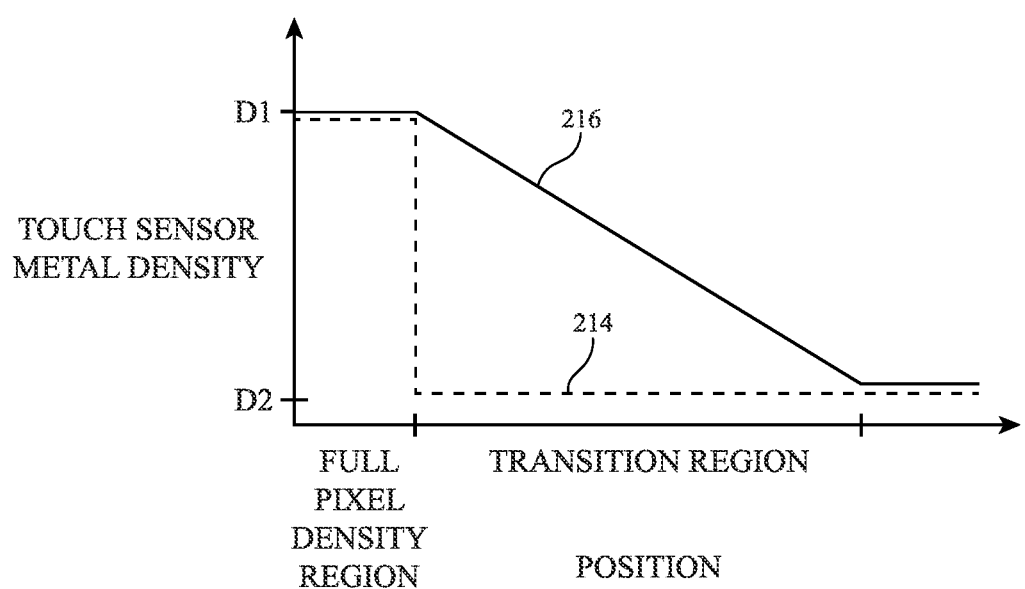
FIG. 18 is a graph of the density of the touch sensor metal layer as a function of position in accordance with an embodiment.

FIG. 18 is a graph showing the density of the touch sensor metal (e.g., the coverage per unit area) as a function of position across the display. Profile 214 shows the density of the touch sensor metal in an embodiment where there is no transition region. As shown, there is a step change from D1 to D2 in the touch sensor metal density at the interface between the full pixel density region and the pixel removal region. The step change may correspond, for example, to a change from a maximum density in full pixel density region 334 to 0% density in pixel removal region 332. This step change in touch sensor metal density may result in perceptible reflectance changes when the display is off.

Profile 216 shows the density of the touch sensor metal from FIG. 17 as a function of position across the display. As shown, the overall touch sensor metal density gradually decreases from D1 (at the interface of the pixel removal region/transition region and the full pixel density region) to D2 (the minimum density at a central portion of the pixel removal region).

Figure 19:
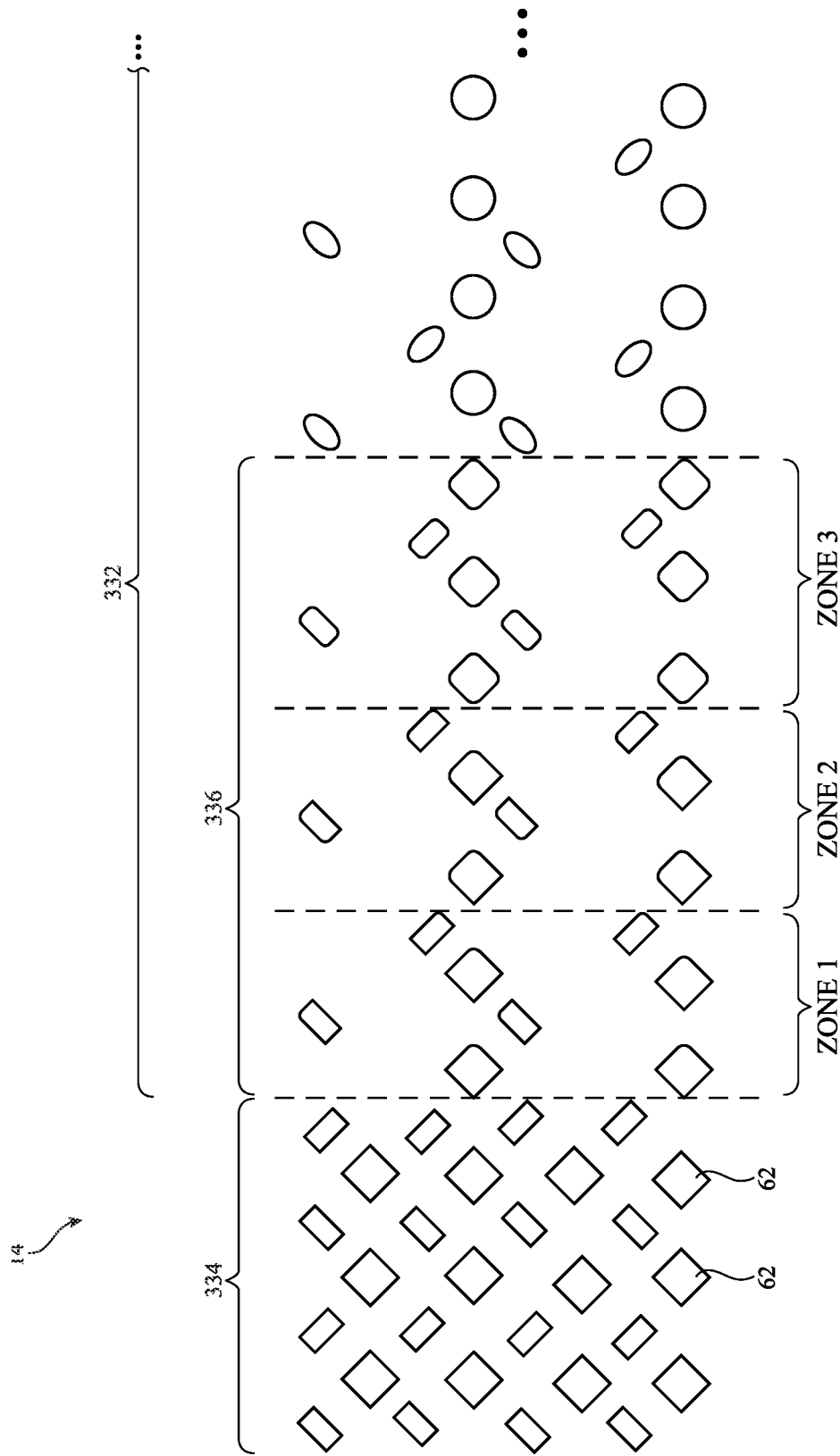
FIG. 19 is a top view of an illustrative transition region that includes anodes that gradually change shape in accordance with an embodiment.

FIG. 19 is a top view of an illustrative display that includes a transition region 336 that has a gradual change in emissive sub-pixel shape. It may be desirable for the anodes (and corresponding emissive sub-pixels) in pixel removal region 332 to have a different shape than in full pixel density region 334. For example, the anode shapes in pixel removal region 332 may be selected to mitigate diffraction artifacts for the sensor that operates through the pixel removal region. In the example of FIG. 19, the anodes in the central portion of the pixel removal region have circular or oval shapes. In contrast, the anodes in full pixel density region 334 have square or rectangular shapes.

Transition region 336 may be included in the display to gradually transition the anode shape between full pixel density region 334 and pixel removal region 332. In the example of FIG. 19, transition region 336 includes a first zone, a second zone, and a third zone. The anode shapes become gradually more curved while moving between zones 1 and 3. As shown in FIG. 19, the anodes in zone 1 have square/rectangular shapes with one rounded corner and three right-angled corners. The anodes in zone 2 have square/rectangular shapes with two rounded corners and two right-angled corners. The anodes in zone 3 have square/rectangular shapes with four rounded corners. In this way, the anodes gradually transition from square/rectangular to circular/oval while moving in the positive X-direction across transition region 336. In other words, there is at least 1 intermediate shape between the shape of the full pixel density region 334 and the shape of the central portion of the pixel removal region 332. More intermediate shapes may be included if desired (e.g., at least 2 intermediate shapes, at least 3 intermediate shapes, at least 4 intermediate shapes, at least 8 intermediate shapes, at least 16 intermediate shapes, etc.).

FIG. 20 is a top view of an illustrative display that includes a transition region 336 that has a gradual change in emissive sub-pixel size. Instead of removing pixels in high-transmittance region 332, the emissive sub-pixels may instead be reduced in size. This may reduce the total area occupied by the opaque emissive sub-pixels, increasing transmission in region 332. In the example of FIG. 20, the anodes in the central portion of the high-transmittance region 332 have the same layout, pitches (center-to-center spacing), and aspect ratios as in normal region 334. However, the anodes in the central portion of the high-transmittance region 332 are smaller than the anodes in normal region 334.

Transition region 336 may be included in the display to gradually transition the anode size between region 334 and region 332. In the example of FIG. 20, transition region 336 includes a first zone and a second zone. The anodes become gradually smaller while moving between zones 1 and 2. As shown in FIG. 20, the anodes in zone 1 have the same shape but a smaller size than the anodes in region 334. The anodes in zone 2 have the same shape but a smaller size than the anodes in zone 1. The anodes in a central portion of region 332 have the same shape but a smaller size than the anodes in zone 2. In this way, the anodes gradually transition in size while moving in the positive X-direction across transition region 336. In other words, there is at least 1 intermediate anode size between the anode size in region 334 and the anode size in the central portion of the high-transmittance region 332. More intermediate sizes may be included if desired (e.g., at least 2 intermediate sizes, at least 3 intermediate sizes, at least 4 intermediate sizes, at least 8 intermediate sizes, at least 16 intermediate sizes, etc.).

It should be noted that any subset of the aforementioned gradients may be included in a single display. Embodiments have been described where dummy thin-film transistor sub-pixels are included to produce a gradual change in thin-film transistor sub-pixel density (as in FIG. 11), where dummy anodes are included to produce a gradual change in emissive sub-pixel density (as in FIG. 13), where the cathode has a gradually changing density (as in FIG. 15), where the touch sensor metal has a gradually changing density (as in FIG. 17), where the anodes have a gradually changing shape (as in FIG. 19), and where the anodes have a gradually changing size (as in FIG. 20). Any subset (or all) of these embodiments may coexist simultaneously in a single display if desired. The width of the transition region for each component may be the same or may be different. The width of each transition region (e.g., the dimension in the direction of the gradient) may be greater than 50 microns, greater than 100 microns, greater than 200 microns, greater than 400 microns, greater than 1000 microns, greater than 3000 microns, less than 400 microns, less than 1000 microns, less than 3000 microns, etc. Each transition region may include (in the direction of the gradient) 1 or more sub-pixels, 4 or more sub-pixels, 10 or more sub-pixels, 20 or more sub-pixels, 50 or more sub-pixels, less than 100 sub-pixels, less than 50 sub-pixels, etc.

In the example of FIG. 10, the transition regions are included only on the left and right sides of the pixel removal region. This example is merely illustrative. Transition regions may instead be included on the top side, bottoms side, left side, and right side of the pixel removal region (as one example). In general, transition regions of the aforementioned types may be included on one or more sides of a pixel removal region.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
an input-output component; and
a display having an array of pixels, wherein the display has:
a first portion having a first pixel density;
a second portion having a second pixel density that is lower than the first pixel density, wherein the second portion overlaps the input-output component; and
a transition portion between the first and second portions, wherein, in the transition portion, at least one component has a density that gradually changes across the transition portion.

2. The electronic device defined in claim 1, wherein the array of pixels includes emissive sub-pixels that emit light and thin-film transistor sub-pixels that control the emissive sub-pixels and wherein the at least one component comprises dummy thin-film transistor sub-pixels.

3. The electronic device defined in claim 2, wherein each one of the dummy thin-film transistor sub-pixels does not control a respective emissive sub-pixel.

4. The electronic device defined in claim 2, wherein each one of the dummy thin-film transistor sub-pixels has a matching size and shape to the thin-film transistor sub-pixels.

5. The electronic device defined in claim 1, wherein the array of pixels includes emissive sub-pixels that emit light and thin-film transistor sub-pixels that control the emissive sub-pixels, wherein each emissive sub-pixel includes a respective anode, and wherein the at least one component comprises dummy anodes.

6. The electronic device defined in claim 5, wherein each one of the dummy anodes has a matching size and shape to at least some of the anodes.

7. The electronic device defined in claim 1, wherein the at least one component comprises a cathode for the array of pixels.

8. The electronic device defined in claim 7, wherein the transition portion has first and second opposing sides, wherein the first side is adjacent the first portion, wherein the second side is adjacent the second portion, and wherein the cathode has openings that gradually increase in density from the first side to the second side.

9. The electronic device defined in claim 1, wherein the at least one component comprises a touch sensor metal layer.

10. The electronic device defined in claim 1, wherein the transition portion has first and second opposing sides, wherein the first side is adjacent the first portion, wherein the second side is adjacent the second portion, and wherein the density of the at least one component gradually decreases from the first side to the second side.

11. The electronic device defined in claim 1, wherein the transition portion has first and second opposing sides, wherein the first side is adjacent the first portion, wherein the second side is adjacent the second portion, and wherein the density of the at least one component gradually increases from the first side to the second side.

12. An electronic device, comprising:
    an input-output component; and
    a display having an array of pixels, wherein the display has a first portion having a first pixel density and a second portion having a second pixel density that is lower than the first pixel density, wherein the second portion overlaps the input-output component, wherein the second portion has first and second opposing sides, and wherein a coverage percentage per unit area of at least one component gradually changes from the first side towards the second side.

13. The electronic device defined in claim 12, wherein the array of pixels includes emissive sub-pixels that emit light and thin-film transistor sub-pixels that control the emissive sub-pixels and wherein the at least one component comprises dummy thin-film transistor sub-pixels.

14. The electronic device defined in claim 13, wherein the second portion includes a quarter of the thin-film transistor sub-pixels per unit area of the first portion.

15. The electronic device defined in claim 14, wherein the thin-film transistor sub-pixels in the second portion are grouped at one or more edges of the second portion.

16. The electronic device defined in claim 14, wherein the second portion includes half of the emissive sub-pixels per unit area of the first portion.

17. The electronic device defined in claim 13, wherein the second portion includes half of the thin-film transistor sub-pixels per unit area of the first portion and half of the emissive sub-pixels per unit area of the first portion.

18. The electronic device defined in claim 12, wherein the array of pixels includes emissive sub-pixels that emit light and thin-film transistor sub-pixels that control the emissive sub-pixels and wherein the at least one component comprises dummy emissive sub-pixels.

19. An electronic device, comprising:
    an input-output component; and
    a display having an array of pixels, wherein each pixel in the array of pixels has a respective emissive sub-pixel and wherein the display has:
        a first portion having a first pixel density, wherein first emissive sub-pixels in the first portion have a first shape;
        a second portion having a second pixel density that is lower than the first pixel density, wherein the second portion overlaps the input-output component and wherein second emissive sub-pixels in the second portion have a second shape that is different than the first shape; and
        a transition portion between the first and second portions, wherein third emissive sub-pixels in the transition portion gradually change shape from the first shape to the second shape.

20. The electronic device defined in claim 19, wherein the second shape has more curvature at its perimeter than the first shape.

21. An electronic device, comprising:
    an input-output component; and
    a display having an array of pixels, wherein each pixel in the array of pixels has a respective emissive sub-pixel and wherein the display has:
        a first portion having a first pixel density, wherein first emissive sub-pixels in the first portion have a first size;
        a second portion having a second pixel density that is lower than the first pixel density, wherein the second portion overlaps the input-output component and wherein second emissive sub-pixels in the second portion have a second size that is smaller than the first size; and
        a transition portion between the first and second portions, wherein third emissive sub-pixels in the transition portion gradually change size from the first size to the second size.

* * * * *